(12) United States Patent
Funaba et al.

(10) Patent No.: US 7,411,806 B2
(45) Date of Patent: Aug. 12, 2008

(54) MEMORY MODULE AND MEMORY SYSTEM

(75) Inventors: Seiji Funaba, Tokyo (JP); Yoji Nishio, Tokyo (JP); Kayoko Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/634,405

(22) Filed: Dec. 6, 2006

(65) Prior Publication Data

US 2007/0081376 A1    Apr. 12, 2007

Related U.S. Application Data

(62) Division of application No. 10/628,517, filed on Jul. 28, 2003, now Pat. No. 7,161,820.

(30) Foreign Application Priority Data

Jul. 31, 2002  (JP) .............................. 2002-222771

(51) Int. Cl.
*G11C 5/06* (2006.01)
*G11C 5/02* (2006.01)

(52) U.S. Cl. .............................. 365/63; 365/51; 365/52

(58) Field of Classification Search ................ 365/63
See application file for complete search history.

(56) References Cited

U.S. PATENT DOCUMENTS

| | | | |
|---|---|---|---|
| 5,530,623 A * | 6/1996 | Sanwo et al. ................. 361/788 |
| 6,142,830 A | 11/2000 | Loeffler | |
| 6,172,895 B1 * | 1/2001 | Brown et al. ................... 365/63 |
| 6,356,106 B1 | 3/2002 | Greeff et al. | |
| 6,392,897 B1 | 5/2002 | Nakase et al. | |
| 6,438,012 B1 | 8/2002 | Osaka et al. | |

(Continued)

FOREIGN PATENT DOCUMENTS

JP    H11-330394    11/1999

(Continued)

OTHER PUBLICATIONS

Japanese Office Action, dated Mar. 20, 2007, from corresponding Japanese patent application 2002-222771.

(Continued)

*Primary Examiner*—Son L Mai
(74) *Attorney, Agent, or Firm*—Katten Muchin Rosenman LLP

(57) ABSTRACT

A memory module has a plurality of DRAMs (115), which share a bus line, on the front surface and the back surface of a board. The bus line is connected through a via hole (113) from a terminal (111) to one end of a strip line (112), and the other end of the strip line is connected to a strip line in the other layer through a via hole (119) provided for looping back the line. A termination resistor (120), provided near a termination voltage terminal (VTT), is connected to the looped-back strip line in the other layer through a via hole. The DRAM terminals are connected to the strip line each through a via hole. This memory module is mounted on a motherboard, on which a memory controller is provided, through a connector. The effective characteristic impedance of the bus line is matched with the characteristic impedance of the line in the motherboard.

13 Claims, 29 Drawing Sheets

U.S. PATENT DOCUMENTS

| | | |
|---|---|---|
| 6,438,014 B2 * | 8/2002 | Funaba et al. .................. 365/63 |
| 6,449,166 B1 | 9/2002 | Sly et al. |
| 6,480,409 B2 | 11/2002 | Parl et al. |
| 6,487,086 B2 * | 11/2002 | Ikeda ......................... 361/772 |
| 6,496,380 B1 * | 12/2002 | Li et al. ...................... 361/760 |
| 6,519,173 B2 | 2/2003 | Funaba et al. |
| 6,590,781 B2 * | 7/2003 | Kollipara et al. ............. 361/760 |
| 6,654,270 B2 * | 11/2003 | Osaka et al. .................. 365/51 |
| 6,661,690 B2 | 12/2003 | Moriarty et al. |
| 6,678,169 B2 * | 1/2004 | Ninomiya ................... 361/780 |
| 6,724,082 B2 * | 4/2004 | McCall et al. ............... 257/723 |
| 6,742,098 B1 | 5/2004 | Halbert et al. |
| 6,765,800 B2 | 7/2004 | Haba et al. |
| 6,771,515 B2 * | 8/2004 | McCall et al. ............... 361/788 |
| 6,772,262 B1 | 8/2004 | Park et al. |
| 6,833,618 B2 | 12/2004 | Ono et al. |
| 6,871,253 B2 | 3/2005 | Greeff et al. |
| 7,016,212 B2 | 3/2006 | Shibata et al. |
| 7,277,988 B2 * | 10/2007 | Gower et al. ................. 711/118 |
| 2001/0040796 A1 | 11/2001 | Kollipara et al. |
| 2003/0007379 A1 * | 1/2003 | Osaka et al. .................. 365/52 |
| 2003/0163606 A1 | 8/2003 | Fukaishi et al. |

FOREIGN PATENT DOCUMENTS

| | | |
|---|---|---|
| JP | 2001-156621 | 6/2001 |
| JP | 2001-244581 | 9/2001 |
| JP | 2001-256772 | 9/2001 |
| JP | 2002-007201 | 1/2002 |
| JP | 2002-023901 | 1/2002 |
| JP | 2002-117000 | 4/2002 |
| WO | 01/45107 | 6/2001 |

OTHER PUBLICATIONS

Naono et al., "First design of high-speed memory system using direct RAM bus technology", Interface, Japan, CQ Publishing Co., Apr. 1, 1999, vol. 25, No. 4, pp. 183-193.

Agata et al., "Differential clock transmission method in large-capacity DRAM", 1992, Institute of Electronics, Information and Communication Engineers, Autumn convention collection of presentations [vol. 5], Japan, Institute of Electronics, Information and Communication Engineers, Sep. 15, 1992, p. 5-150.

English translation for Naono et al., "First design of high-speed memory system using direct RAM bus technology", Interface, Japan, CQ Publishing Co., Apr. 1, 1999, vol. 25, No. 4, pp. 183-193.

English translation for Agata et al., "Differential clock transmission method in large-capacity DRAM", 1992, Institute of Electronics, Information and Communication Engineers, Autumn convention collection of presentations [vol. 5]Japan, Institute of Electronics, Information and Communication Engineers, Sep. 15, 1992, p. 5-150.

* cited by examiner

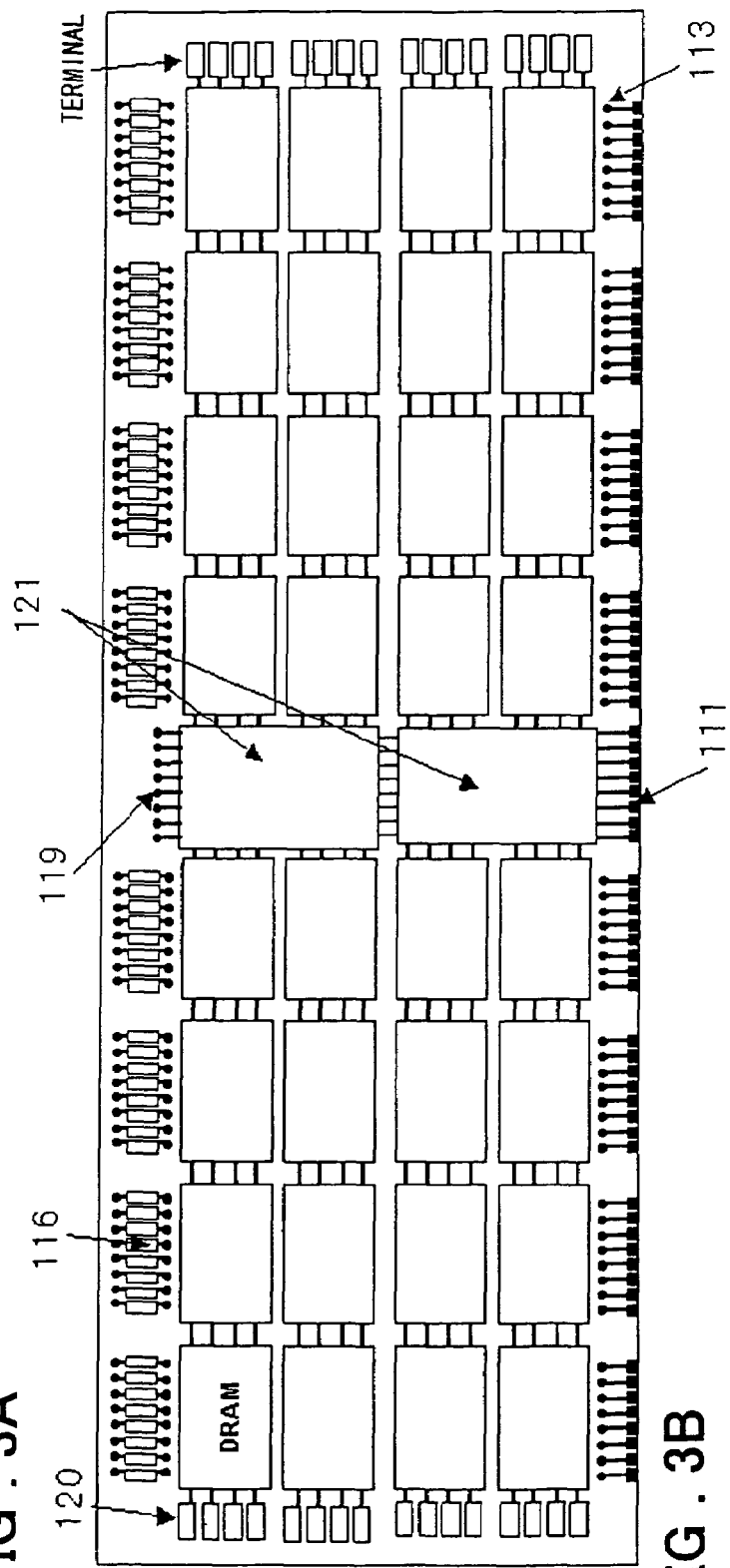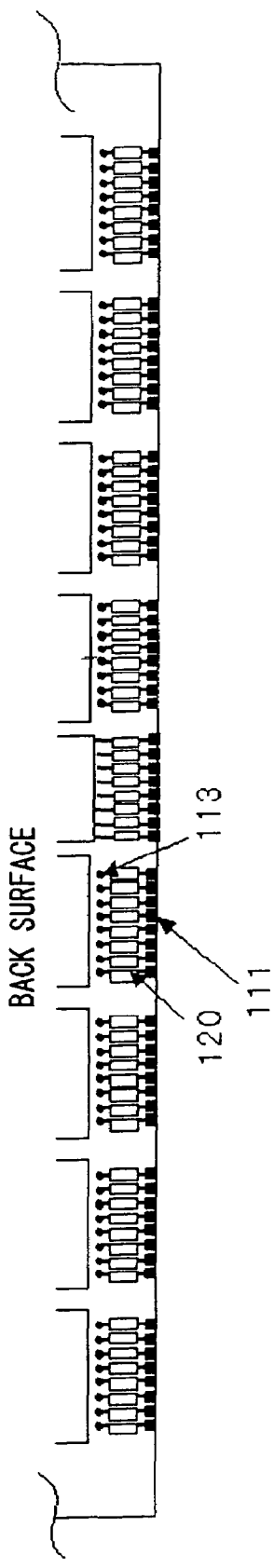

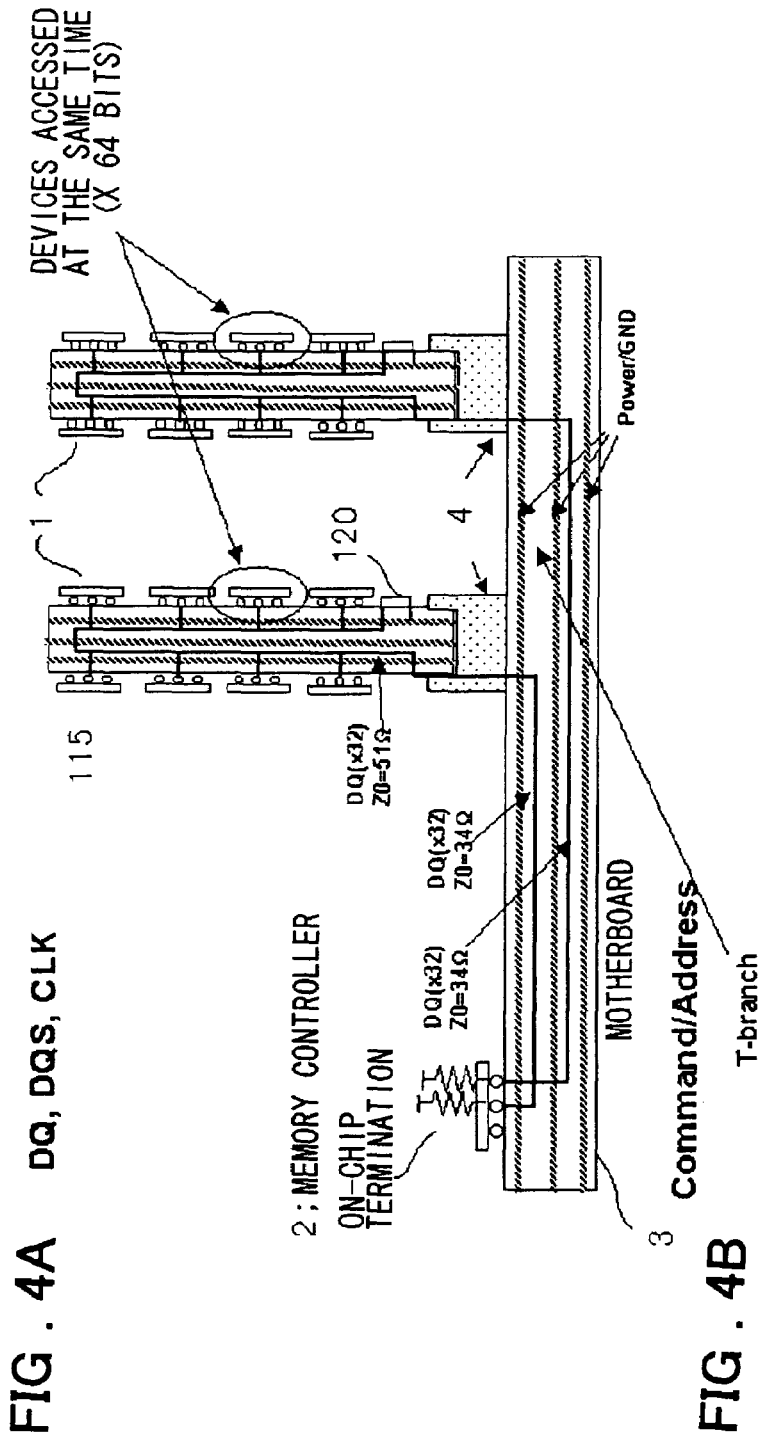
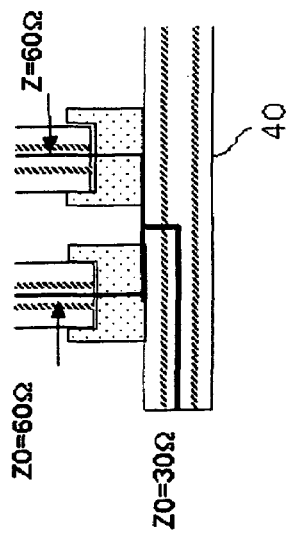
FIG. 4A
FIG. 4B

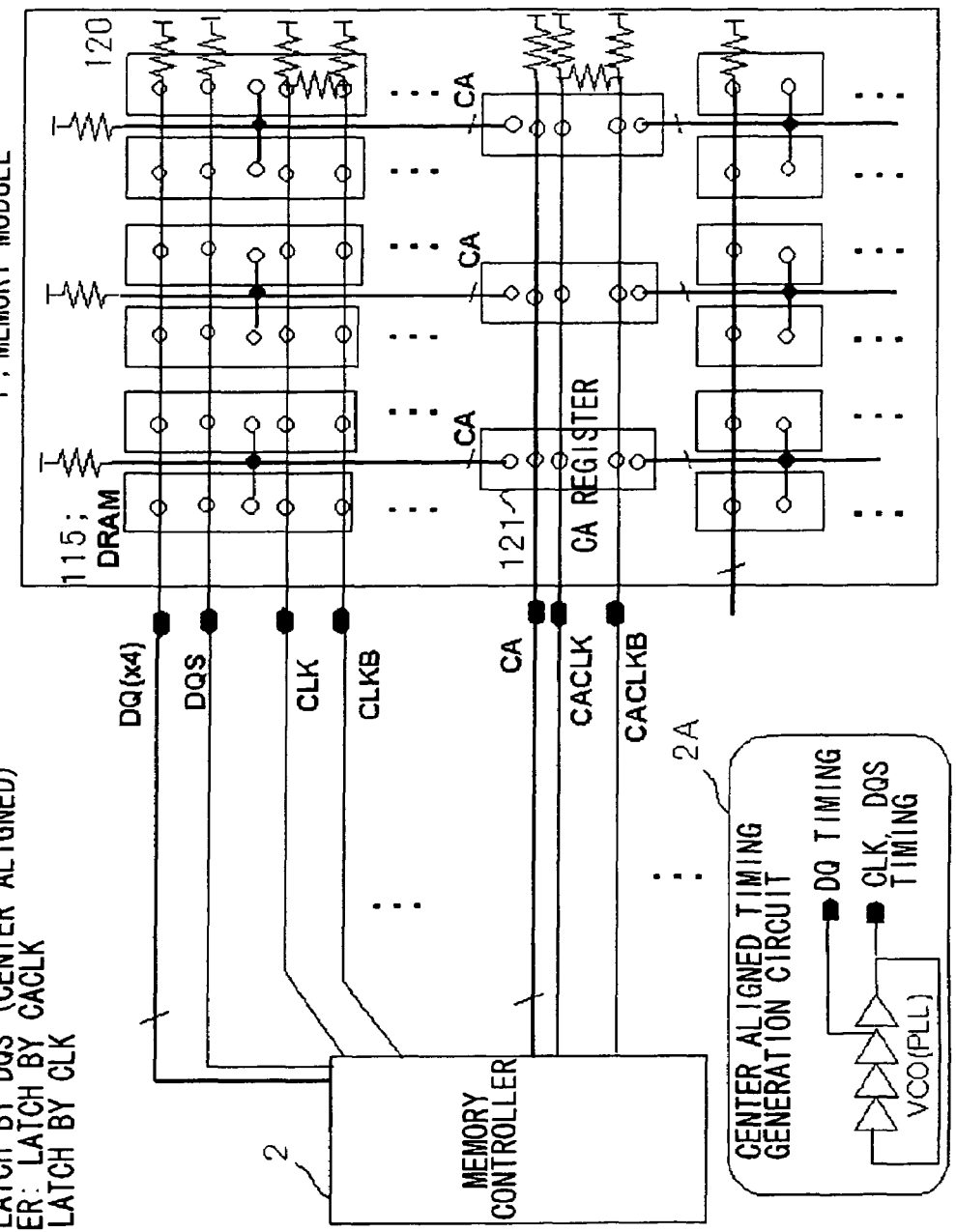

FIG. 6B ON-CHIP TERMINATOR
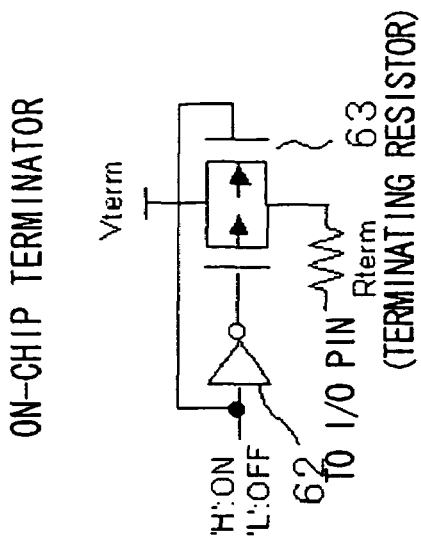
FIG. 6A
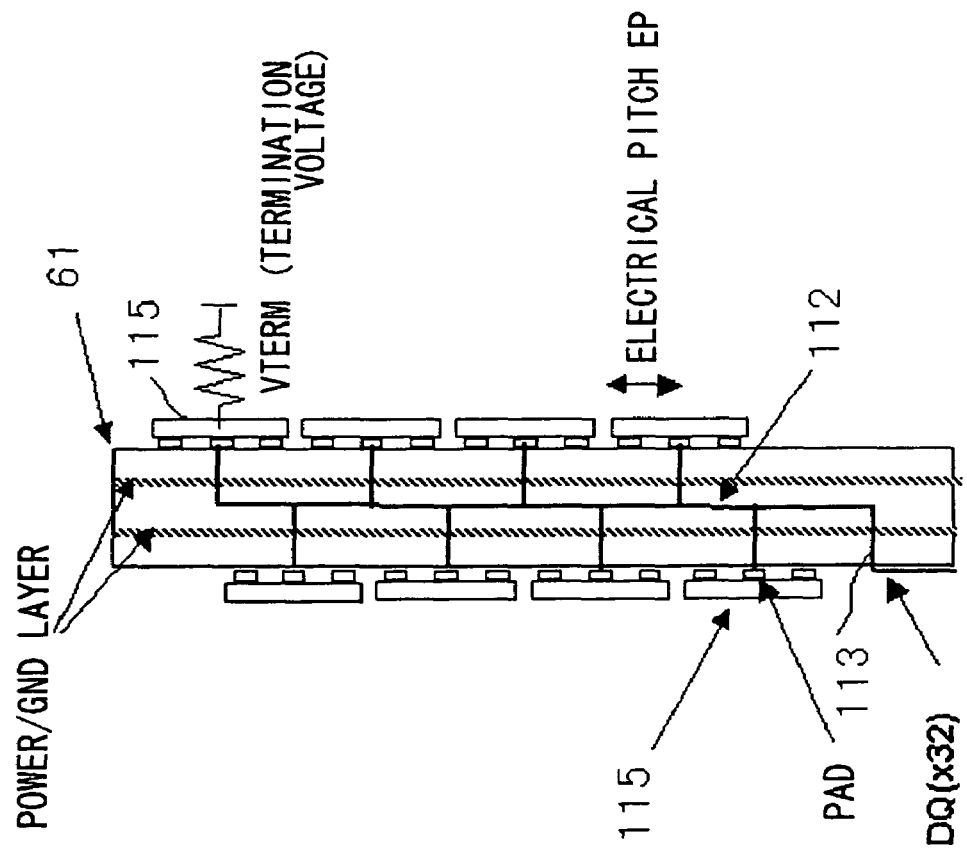

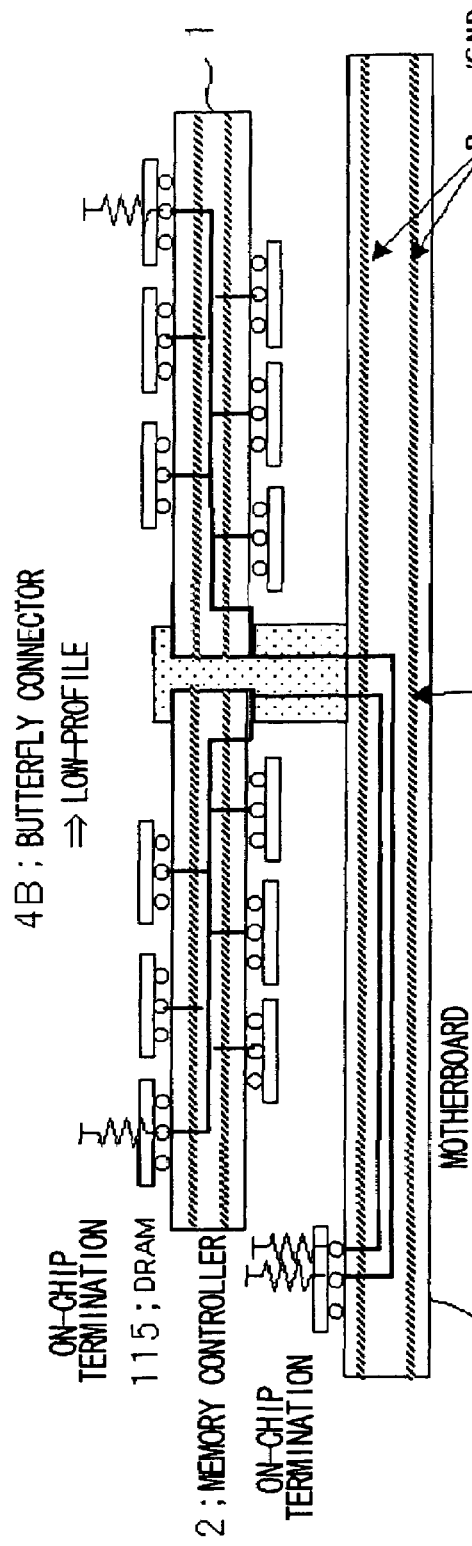
FIG. 8A    DQ, DQS, CLK
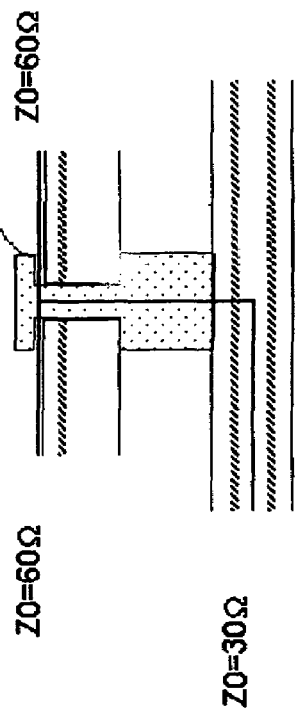
FIG. 8B    Command/Address

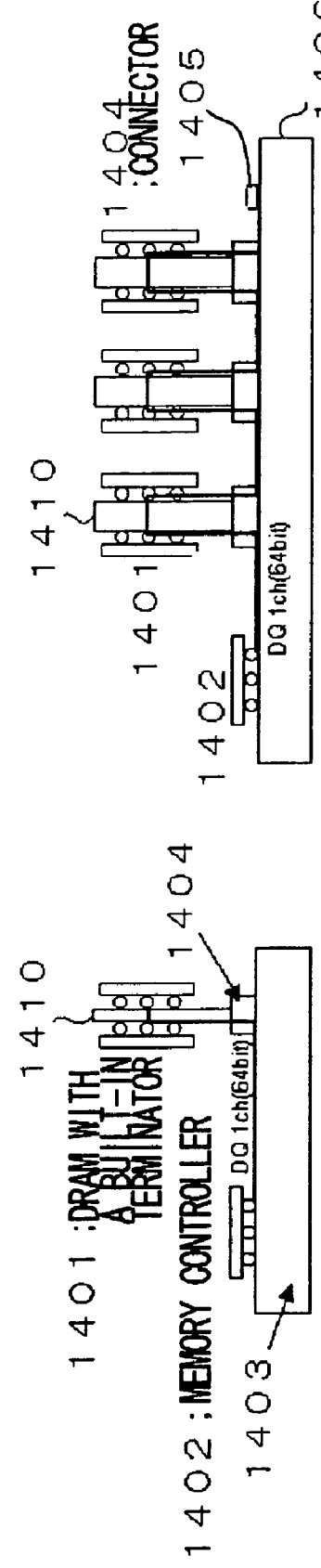
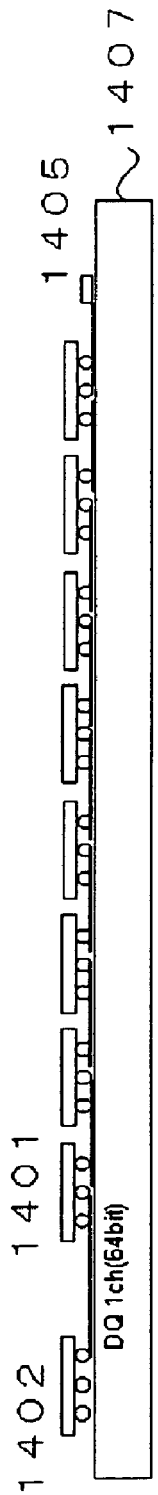
FIG. 14b CONVENTIONAL STUBLESS CONFIGURATION PRIOR ART
FIG. 14c DIRECT STUBLESS CONFIGURATION PRIOR ART
FIG. 14a Point to Point PRIOR ART

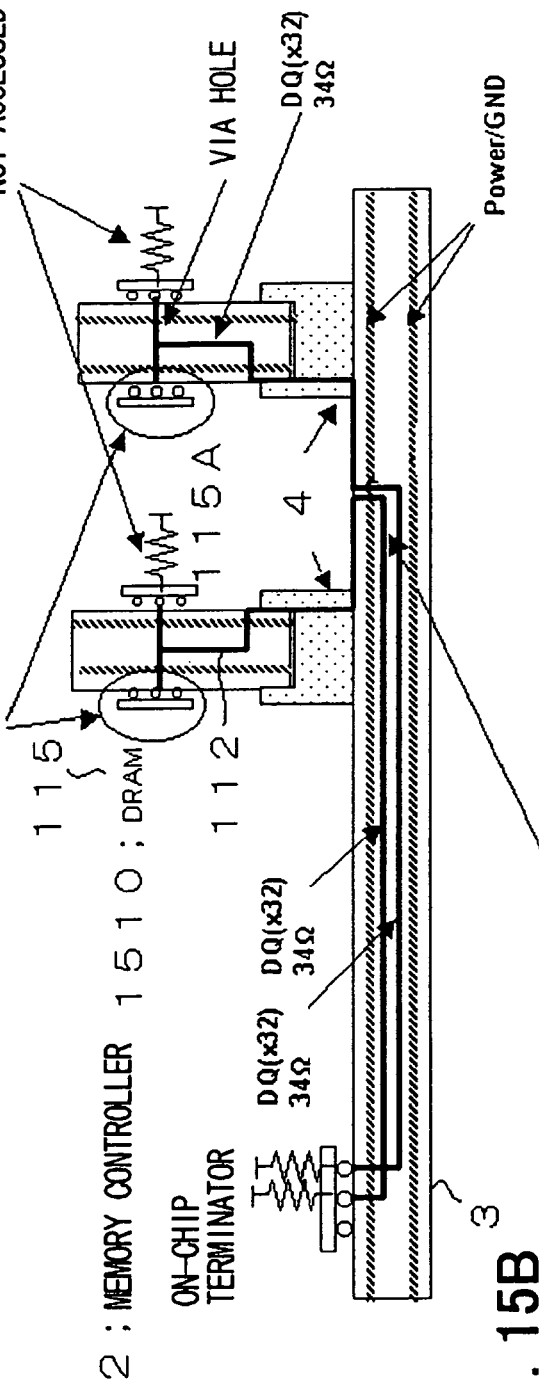
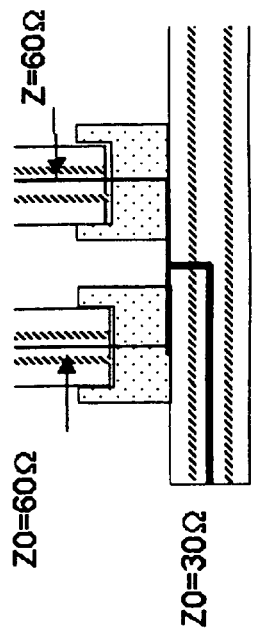

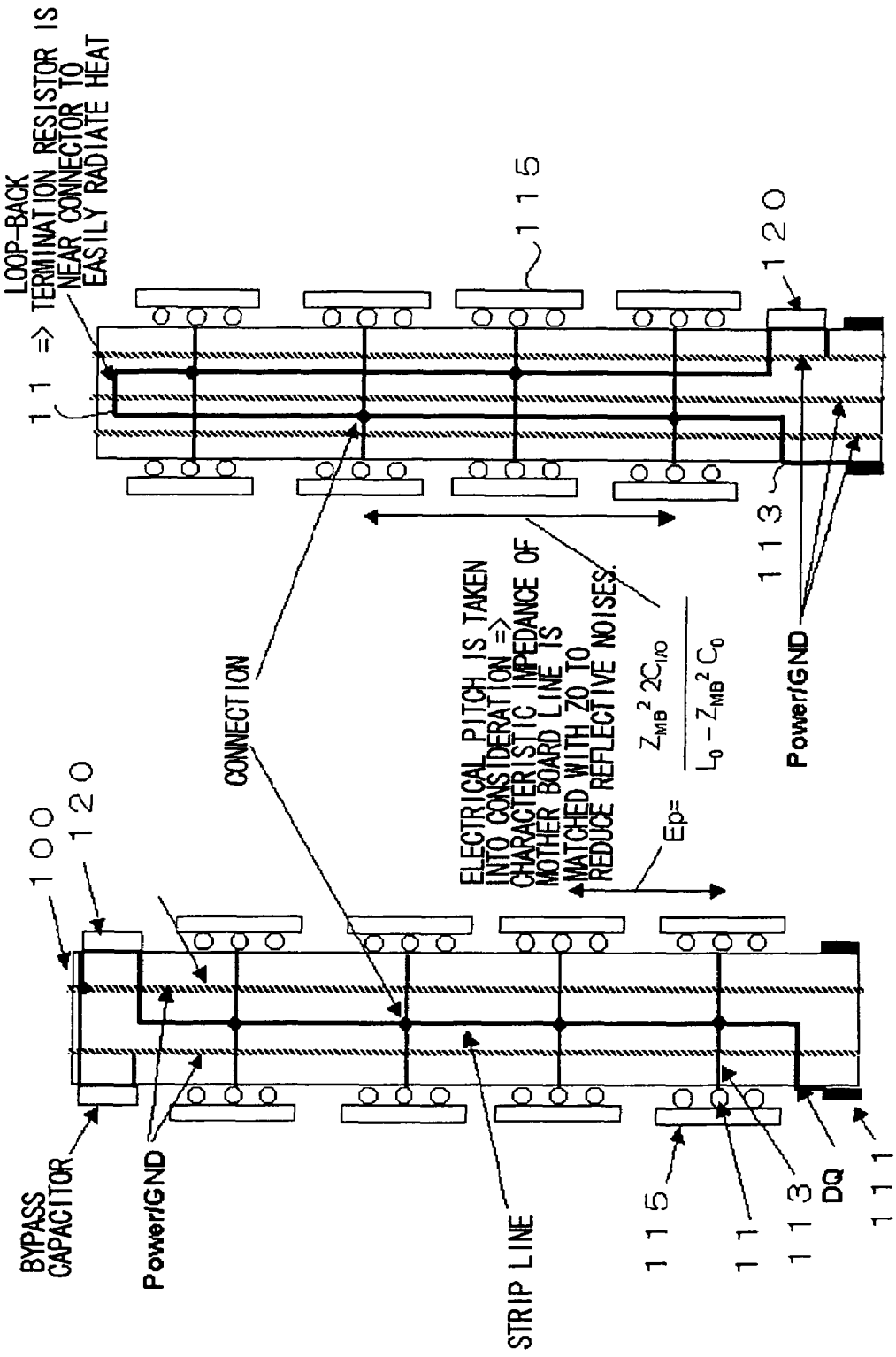

HEAT PIPE BUILT-IN CONNECTOR

# MEMORY MODULE AND MEMORY SYSTEM

This application is a divisional of U.S. application Ser. No. 10/628,517 filed Jul. 28, 2003, U.S. Pat. No. 7,161,820, and claim priority from Japanese Patent Application No. 2002-222771 filed Jul. 31, 2002, the contents of which are herein incorporated by reference.

FIELD OF THE INVENTION

The present invention relates to a memory system and a memory module.

BACKGROUND OF THE INVENTION

FIG. 14a-FIG. 14c are diagrams showing typical configurations of a conventional high-speed memory interface.

(1) Point to Point Type

As shown in FIG. 14a, a memory controller 1402 and a memory 1401 (DRAM with a built-in terminator) are connected in a point-to-point configuration. The DRAMs (Dynamic Random Memory) 1401 are mounted on both sides of a module board 1410 with DQ terminal of the DRAM 1401 on the front surface of the board 1410 connected to the DQ terminal of the DRAM 1401 on the back surface via a through hole. The DQ signal is terminated by a termination circuit in DRAM with a built-in terminator 1401 at the end of an interconnection.

Although this configuration allows high speed signal transmission, the place where the memory can be arranged only is limited to one position (that is, at the end of the bus), as a result of which, the problem is that the memory capacity cannot be increased.

(2) Conventional Stubless Type

As shown in FIG. 14b, the memory controller 1402 and the memories (DRAM) 1401 are connected in a stubless configuration via a connector 1404, in which there is no branch on a long line that is a deemed as a distributed constant line with regard to signal transmission.

In the configuration shown in FIG. 14b, the memory expansion is made possible because connectors 1404 are provided on a motherboard 1406. Three slots are provided on the motherboard in FIG. 14b, and the interconnection is terminated by a termination resistor 1405 on the motherboard 1406.

The number of times the signal passes through the connector 1404 is twice as many as the number of slots in the configuration shown in FIG. 14b and thus the signal degradation is increased. Hence, there exists a problem that as more slots are added to increase memory capacity, the degradation of signal waveform is enlarged.

(3) Directly Mounted Stubless Type

As shown in FIG. 14c, the memory controller 1402 is connected to the memories 1401 in a stubless configuration, not via a connector, with the memories 1401 mounted directly on a motherboard 1407.

In the configuration shown in FIG. 14c, the signal is transmitted at a high speed and a high-capacity memory may be installed. The problem is that the memory cannot be increased (memory capacity cannot be changed) because the memories 1401 are mounted directly on the motherboard 1407.

SUMMARY OF THE DISCLOSURE

Accordingly, it is an object of the present invention to provide a memory module and a memory system that minimize pass of a signal through a connector, that make it possible to change memory capacity such as memory expansion, that increase signal transmission speed, and that allow high-capacity memory to be installed.

The above and other objects are attained by a memory module according to the present invention, comprising a plurality of memory devices sharing a bus line which connects the terminals of the plurality of memory devices in a stubless configuration, that is, in a single stroke, with the end of the bus line being terminated.

In a memory module according to the present invention, at least a part of the bus line is made up of a strip line.

In a memory module according to the present invention, the effective characteristic impedance of the bus line is matched with the characteristic impedance of the motherboard.

In a memory module according to the present invention, at least one of the plurality of memory devices is a memory device including a termination circuit and the memory device including the termination circuit terminates the end of the bus line.

In a memory module according to the present invention, the memory devices on the front surface and the back surface of the module board are connected alternately to the strip line through via holes.

In a memory module according to the present invention, the power supply layer and the ground layer, between which the strip line is provided to form the bus line, are connected by a bypass capacitor or the common power supply layer and the ground layer are shorted at a position near the loop-back point of the bus line.

In a memory module according to the present invention, the signal terminals of the plurality of memory devices connected in a stubless configuration are connected at one point on the bus.

In a memory module according to the present invention, a register connected to the bus line for performing signal conversion is provided on the board.

In a memory module according to the present invention, the memory device has a strip line as a line between a pin on the package board and the memory chip.

In a memory module according to the present invention, the memory module is formed as a multi-chip module.

In a memory system according to the present invention, the bus line of a memory module comprises a bus line for a data signal. The memory system comprises a memory controller that sends a command/address signal to the memory device of the memory module and transfers the data signal to and from the memory device, wherein data lines between the memory controller and slots are connected in a point to point configuration.

In a memory system according to the present invention, at least a part of the data line between the memory controller and the slots is a strip line.

In a memory system according to the present invention, a shield is provided between the data lines.

In a memory system according to the present invention, the command address signal line between the memory controller and the two slots is in the T-branch structure.

In a memory system according to the present invention, the data line is terminated on the memory controller and on the memory module.

In a memory system according to the present invention, one channel (one DQ signal) is divided into a plurality of slots.

In a memory system according to the present invention, the memory module comprises a memory device having a termination circuit on the board and is in a 2-Rank (bus is shared by devices on front and back surfaces), load-concentration configuration (The connection between the memory controller and the memory devices is equivalent to a point-to-point bus connection). The line is terminated by one of memory devices that is not accessed or driven.

In a memory system according to the present invention, the reference voltage (Vref) is generated by the memory controller and the memory device that terminates the bus line.

In a memory module according to the present invention, the memory module board may be composed of a plurality of divided boards connected by inter-board connection means such as a flexible film.

In a memory module according to the present invention, the memory device and/or a register mounted on the memory module and connected to the bus line has an input terminal and an output terminal separately, instead of having a two-way input/output terminal, for at least one two-way signal of the bus line. The bus line has a one-way input signal line and a one-way output signal line separately, which are connected to the input terminal and the output terminal, instead of having a two-way signal line.

In a memory system according to the present invention, the memory device and/or a register mounted on the memory module and connected to the bus line may differentially transmit at least one signal of the bus line to or from the memory controller on the motherboard via the connector.

BRIEF DESCRIPTION OF THE DRAWINGS

FIG. 3A is a diagram showing the front surface of the memory module in one embodiment of the present invention, and FIG. 3(B) is a diagram showing a part of the back surface.

FIG. 4A is a diagram showing the configuration of a memory system in one embodiment of the present invention, and FIG. 4(B) is a partially enlarged view showing a T branch structure.

FIG. 5 is a diagram showing the configuration of a data latch (one slot) in the memory system in one embodiment of the present invention.

FIG. 6 is a diagram showing the configuration of a memory module in a second embodiment of the present invention.

FIG. 8(A) is a diagram showing the configuration of a memory system in a second embodiment of the present invention, and FIG. 8(B) is the partially enlarged view of a T branch structure.

FIG. 14(a) is a diagram showing the point-to-point connection, FIG. 14(b) is a diagram showing a conventional stubless configuration, and FIG. 14(c) is a diagram showing the configuration of a direct stubless configuration.

FIG. 15 is a diagram showing the configuration of a memory system in a fourth embodiment of the present invention.

FIG. 16 is a diagram showing the configuration of a memory module in a fourth embodiment of the present invention.

FIG. 22 is a diagram showing the configuration of a memory system in a ninth embodiment of the present invention.

PREFERRED EMBODIMENTS OF THE INVENTION

Figure 1B:
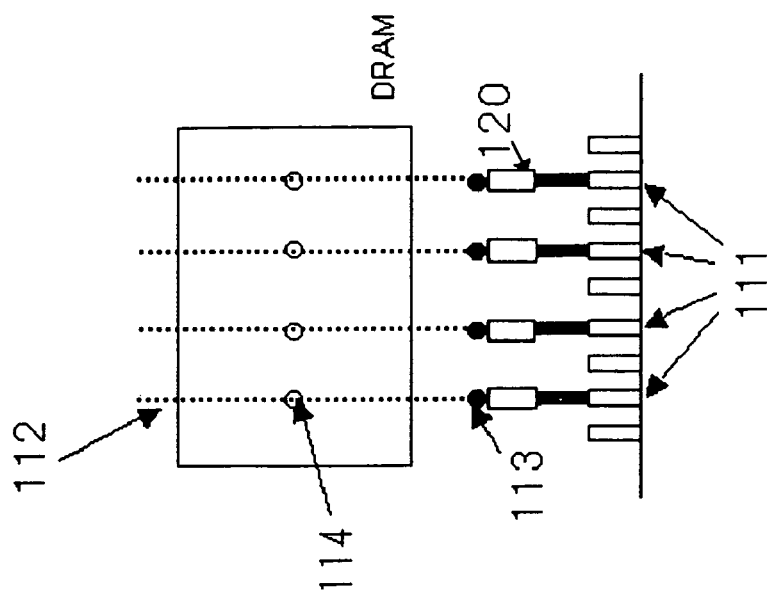
FIG. 1B is a top view.

Preferred embodiments of the present invention will be described in the below. First, the principle of the present invention is described, followed by the detailed description of the embodiments of the present invention.

The inventor and the colleagues earnestly studied the bus configuration of a 1.2 Gbps-class high-speed memory interface. The inventor and the colleagues have invented an absolutely new configuration, in which a direct stubless configuration is build up on a memory module. This configuration minimizes signal passage through connectors, allow memory expansion, (capacity change) and high speed signal transmission, and allows a high-capacity memory to be installed, In a bus configuration according to the present invention, a stubless memory bus which has a termination and is directly mounted on a board is built on a memory module (1 in FIG. 4) using a strip line. The memory module (1) is mounted on a motherboard (3 in FIG. 4), on which a memory controller (2 in FIG. 4) is mounted, through a connector (4 in FIG. 4). The memory module (1) has a bus line for one data signal. The bus line connects the terminals of a plurality of memories (115) in a stubless configuration, that is, in a single stroke, using a strip line with its end terminated on the memory module (1). The effective characteristic impedance of the bus line is matched with the characteristic impedance of the wiring of the motherboard (3).

In addition, in a bus configuration according to the present invention, module terminals (111) are provided on one side of the board, and the bus line extended in the direction of the other side of the board is looped back so that the return current is not cut in pieces. A termination circuit (120) is provided near a module terminal (VTT).

That is, a memory module (1) in one embodiment of the present invention has a plurality of memory devices (115 in FIG. 1), which share a bus line, on a front surface and a back surface of a module board, wherein the bus line is arranged on the front surface of the board from a first module terminal (111 in FIG. 1) to a via hole (113 in FIG. 1) which is spaced from the first module terminal and the bus line is connected to one end of a first strip line (112 in FIG. 1) through the via hole. The terminals of memory devices (115 in FIG. 1) mounted on the front surface of the board are connected to the first strip line (112 in FIG. 1) through via holes. The other end of the first strip line is connected to one end of a second strip line (112) through a loop-back via hole (119 in FIG. 1). The second strip line (112) is extended in a direction opposite to the one direction and the terminals of the memory devices mounted on the back surface of the board are connected to the strip line through via holes. A termination resistor (120 in FIG. 1) is provided near a termination voltage terminal (VTT), and the termination resistor is connected through the via hole to the other end of the strip line that is looped.

A memory module according to the present invention also includes a module with a configuration not including the loop-back. That is, a memory module (1) according to one embodiment of the present invention comprises a board which has a plurality of memory devices sharing a bus line mounted on at least one of a front surface and a back surface thereof. The bus line is connected to one end of a strip line (112) through a via hole (113) on the board. The terminals of a plurality of memory devices on the board are connected to the strip line through associated via holes. The other end of the strip line is connected through a via hole to a termination circuit or to a memory device with a built-in termination circuit (115 in FIG. 6) which is provided on the front surface or on the back surface of the board, and is terminated.

According to the present invention, a strip line is used as the data signal line between a memory controller and a connector in a point-to-point connection configuration, and a memory module is mounted in the connector.

According to the present invention, a DDR (Double Data Rate) memory is mounted in a memory module and, in addition, one channel (64 or 72 bits) is distributed into a plurality of slots.

According to the present invention, a memory device (or a register) may have an input terminal and an output terminal (QDR (Quad Data Rate) memory and the like) separately, instead of one input/output terminal (an I/O common terminal), for at least one two-way signal of a bus line, wherein the bus line has a one-way input signal line (112A in FIG. 24) and a one-way output signal line (112B in FIG. 24) connected respectively to the input terminal and the output terminal of the memory device (or register), and a memory controller (2) on the mother board (3) has an input terminal and an output terminal corresponding to the input terminal and the output terminal of the memory device or the register. In this embodiment, the output terminal and the input terminal of the memory controller (2) are connected respectively to the input terminal and the output terminal of the memory device (115), for example, in a point-to-point connection configuration via a one-way line.

Figure 28:
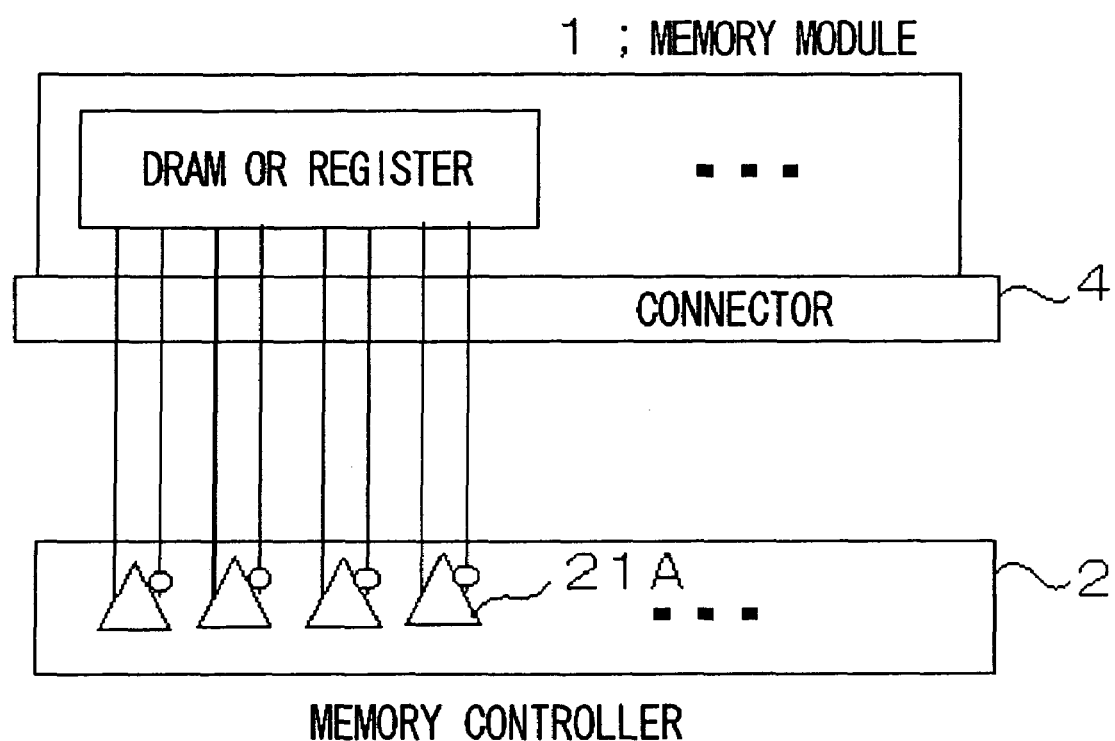
FIG. 28 is a diagram showing the configuration of a memory system in a twelfth embodiment of the present invention.

In one embodiment of the present invention, a memory device and/or a register mounted on the memory module and connected to the bus line may differentially transmits at least one signal of the bus line to and from the memory controller on the motherboard connected via the connector (see FIG. 28).

Figure 29A:
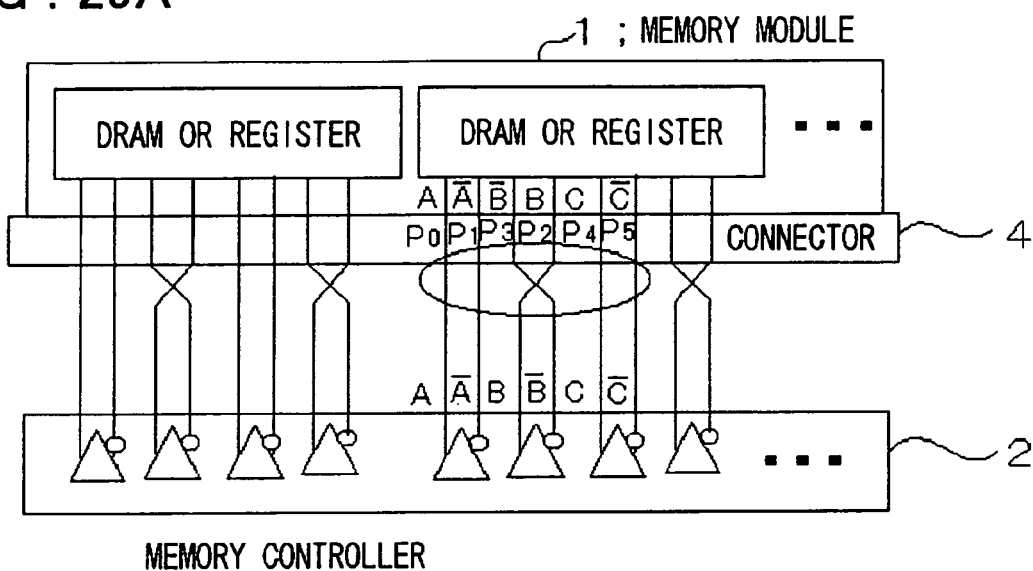
FIG. 29 is a diagram showing the configuration of a memory system in a thirteenth embodiment of the present invention.

In a memory system in one embodiment of the present invention, the configuration may be such that at least one line pair out of a plurality of line pairs, over which the signal is differentially transmitted, is composed of a first line and a second line which are complementary each other and are placed in this order in a connection from the memory controller to the connector, the positions are exchanged and the lines are placed in order of the second line and the first line in a connection from the connector to the memory module, and a line pair composed of complementary signals whose positions are exchanged and a line pair composed of complementary signals whose positions are not exchanged are provided alternately (see FIG. 29). The embodiments of the present invention will be described in detail with reference to the drawings.

Figure 1A:
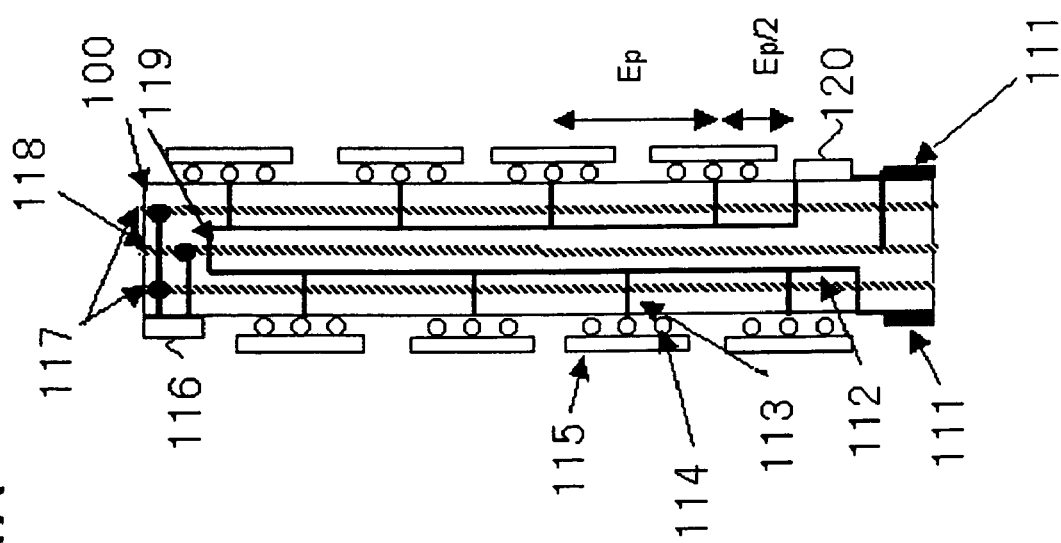
FIG. 1A is a cross sectional view showing the configuration of one embodiment of a memory module of the present invention.

FIGS. 1A and 1B is a diagram showing an example of the configuration of a memory module in accordance with a first embodiment of the present invention. FIG. 1A is a cross sectional view and FIG. 1B is a top view wherein one DQ bus line is shown. Referring to FIGS. 1A and 1b, a memory module in accordance with the present embodiment has a plurality of DRAMs 115, which share a bus line, on the front surface and the back surface of the module board. The bus line is extended on the front surface of the board from a first module terminal (DQ) 111 to a via hole 113 spaced from the first module terminal and is connected to one end of a first strip line 112 through the via hole 113. The signal terminal of a DRAM 115 mounted on the front surface of the board is connected to the first strip line 112 through an associated via hole. The first strip line is extended in one direction, and the other end corresponding to said one end is connected to the one end of a second strip line 112 on the back surface through a loop-back via hole 119. The second strip line 112 is extended in the direction opposite to the one direction, and the terminal of a DRAM 115 mounted on the back surface of the board is connected to the second strip line through an associated via hole. A termination resistor provided near a voltage termination terminal (VTT) is mounted on the back surface of the board. The termination resistor 120 is connected to the other end of the looped back second strip line through a via hole.

One line is connected from the memory module terminal 111 to the four DRAMs 115 on the front surface of a printed circuit board 100 in a stubless configuration and is looped back through the via hole 119 that composes a folding part. The line is then connected to the four DRAMs 115 on the back surface in the stubless configuration and is connected to the terminal power supply VTT through the termination resistor 120.

The line (interconnection) is embedded in the dielectric material and is formed as the so-called strip line 112 between the power supply VDD layer and the GND layer. The line is connected to a pin 114 of the DRAM 115 through the via hole 113.

In this case, the effective characteristic impedance of the DQ bus line is matched with the characteristic impedance of the line on the motherboard (3 in FIG. 4).

Characteristic impedance matching is implemented by setting Ep (Electrical Pitch), which is the distance of interconnection between two DRAMs 115, to a value defined by the expression below:

$$E_p = Z_{MB}^2 C_{I/O} / (L_0 - Z_{MB}^2 C_0) \tag{1}$$

where, $Z_{MB}$ is a characteristic impedance of the line on the motherboard, $C_{I/O}$ is a I/O load capacity of DRAM (n times the value when n DRAM terminals are connected at a point on the path), $L_0$ is an inductance per unit length of memory module line, and $C_0$ is a capacitance per unit length of memory module line.

The via hole 113, usually sufficiently small, is not regarded as a stub.

Figure 2:
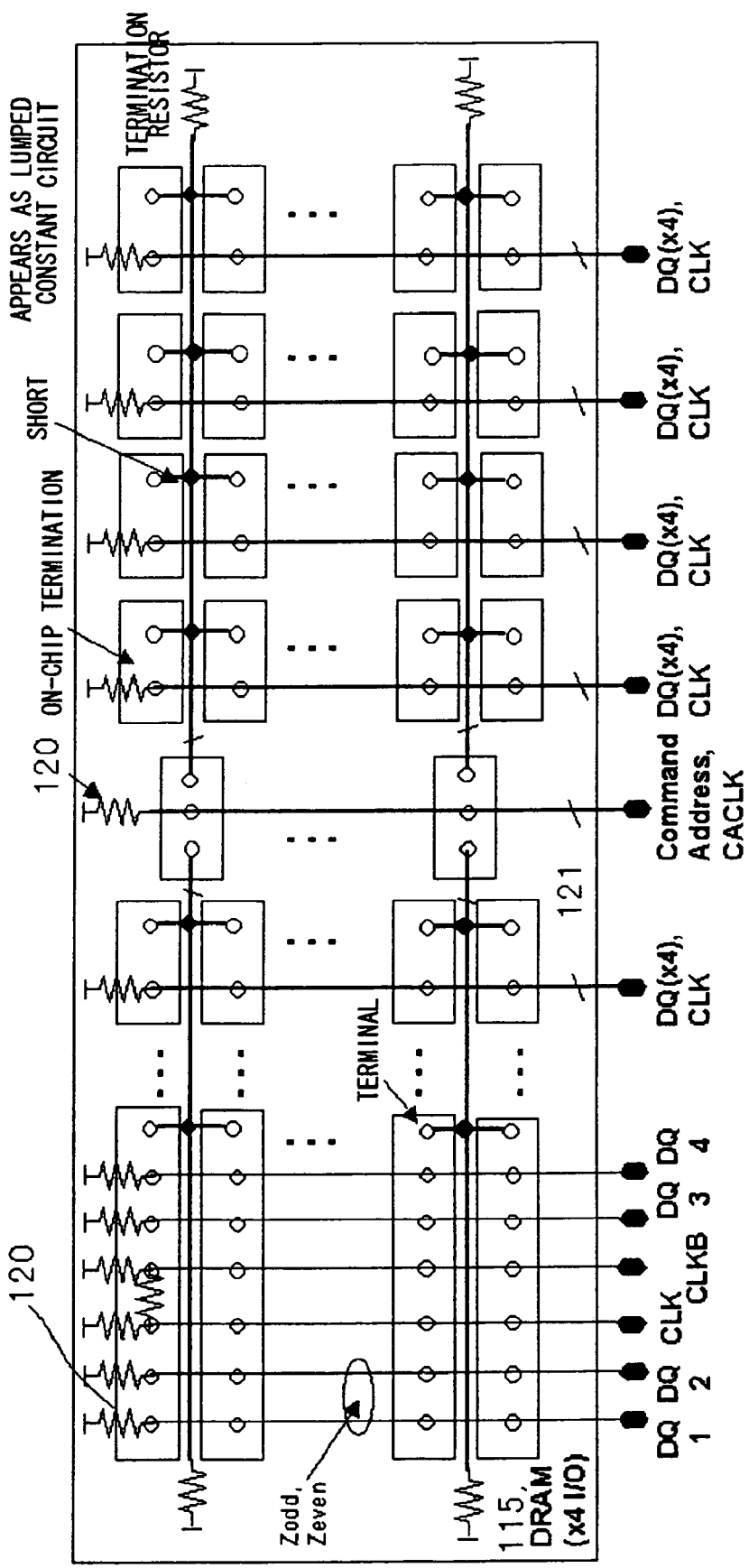
FIG. 2 is a diagram showing the configuration of one embodiment of the memory module of the present invention.

FIG. 2 is a diagram showing an example of the configuration of a memory module in the first embodiment of the present invention. The memory module comprises 4-bit I/O DRAMs, command/address register (CA register) 121 that latches the command/address (Command Address) signal supplied from a chip set, not shown, to the DRAMs, terminating register 120, DQ signal line, CA (Command Address) signal line, and clock signal line (CLK). The DQ signal line and the clock signal lines CLK and CLKB are connected from memory module terminals to the plurality of DRAM terminals in a stubless configuration and are terminated by the DRAM on-chip termination (build-in termination resistor) on the DRAM at the end. The CLK signal and CLKB signal are differential clock signals.

The CA (Command Address) signal line is connected from the memory module terminal to a plurality of CA register terminals in the stubless configuration and its end is terminated by the termination resistor 120.

The CA register 121 is also connected to the DRAMs 115 in the sutbless configuration and is terminated by the termination resistor 120 at the end. The GND layer is shorted and the power supply and the GND layer are connected by a bypass capacitor so that the return current flowing through the power-supply/GND layer is not cut in pieces at a point near the bus line loop-back point.

FIG. 3A is a top view showing the external appearance of the memory module in accordance with the first embodiment of the present invention, and FIG. 3B is a diagram showing a part of the back surface. In this example, a line which is connected from the terminal 111 of the memory module to the DRAMs 115 is extended from the terminal 111 to a via hole 113 and, through the via hole 113, enters the internal layer of the memory module board. The interconnections of the DQ signal and CLK signal are arranged respectively as strip lines.

FIG. 4 is a diagram showing the interconnection of the DQ signal and CA signal in the memory system in accordance with the first embodiment of the present invention. FIG. 4 shows an example of a 64-bit DQ (1 channel) system composed of two slots. The DQ signal is connected from a memory controller 2 to both slots each via the 32-bit connector 4 in the point-to-point configuration. The memory module 1 which is the same one shown in FIG. 1 is inserted in each slot.

In this embodiment, a strip line is used as an interconnection from the memory controller 2 to the slots on a motherboard 3 as in the inner layer of the memory module 1.

The memory controller 2 has an on-chip terminator, which works with the termination resistor 120 on the memory module 1 to form a both-end-terminated bus.

As the CA signal (Command/Address), the signal common to both slots is provided from the memory controller 2. As shown in FIG. 4B, the CA interconnection is connected from the memory controller 2 to a point near the connector 4 with the characteristic impedance of Z0 (for example, 30 Ω) and is branched through two lines with respective impedance of 2×Z0(60 Ω) to both slots in a so-called T-branch structure. In this case, the effective characteristic impedance of the CA interconnection of the memory modules 1 is also 2×Z0(60 Ω) and hence impedance matching is realized.

FIG. 5 is a diagram showing how to latch one slot of data in the embodiment of the memory system of the present invention shown in FIGS. 4A and 4B.

First, at write time, the memory controller 2 outputs the DQ signal and the clock (CLK) signal to the DRAM 115. The DQ signal is output at a double data rate. The DRAM 115 latches the DQ signal based on the CLK signal (DQ@ Write: Latch by CLK).

The phase of the CLK signal output by the memory controller 2 is delayed from the phase of the DQ signal by ¼ period (center aligned). The center aligned timing signal generation circuit 2A generates the DQ signal that leads the CLK signal by a phase difference of 90. The center aligned timing signal generation circuit 2A, composed of a voltage controlled oscillator (VCO) or a PLL circuit that outputs signals equally spaced at an equal interval (90) generates the CLK signal that is delayed from the timing of the DQ signal by 90.

At read time, the DRAM 115 outputs the DQ signal and the DQ strobe signal (DQS) to the memory controller 2.

The memory controller 2 latches the DQ signal based on the DQ strobe signal received from the DRAM 115 (DQ@ Read: Latch by DQS). The phase of the DQ strobe signal output by the DRAM 115 is caused to be delayed from the phase of the DQ signal by the ¼ period (center aligned).

For the CA signal, the memory controller 2 outputs the CA signal and the CACLK signal to the CA register 121 at a single data rate. The CA register 121 latches the CA signal based on the CACLK signal (CA@ register: Latch by CACLK).

The phase of the CACLK signal output by the memory controller 2 is caused to be delayed from the phase of the CA signal by the ¼ period (center aligned).

The CA register 121 outputs the CA signal to the DRAM 115 via the internal CA bus line at a single data rate.

The DRAM 115 latches the CA signal by using the CLK signal as a sampling clock (CA@ DRAM: Latch by CLK).

In the memory module 1 in accordance with this embodiment, one data bus line is used to connect the terminals of the memories (two or more) 115 together in the stubless (single strobe) configuration. This reduces signal reflection and, at the same time, allows more memories to be connected.

In the memory module 1 in accordance with this embodiment, the bus line is formed using the strip line 112. This reduces a cross-talk at the far end.

In the memory module 1 in accordance with this embodiment, the effective characteristic impedance of the data bus line of the memory module 1 is matched with the characteristic impedance of the wiring (interconnection) on the motherboard. This reduces the signal reflection at the joint between the motherboard and the memory module.

In the memory module 1 in accordance with this embodiment, the data bus line is looped back and the terminator (resistor) is provided near the memory module terminal, that is, near the connector 4 (see FIG. 4). This configuration reduces a power supply impedance at the terminator and prevents the occurrence of ground (GND) bounce. In addition, heat generated in the termination resistor 120 is easily radiated to the motherboard 3 through the metallic part of the connector 4 (see FIG. 4), thus preventing a temperature rise in the memory module 1.

In the memory module 1 in accordance with this embodiment, the return current path is provided near the loop-back point of the data bus line. This configuration minimizes the local fluctuation in the characteristic impedance of the data bus line, prevents signal reflection, and reduces signal noise.

The memory system in accordance with this embodiment is adapted so that the memory modules are mounted in the slots on the motherboard, as a result of which, the memory modules may be replaced.

In the memory system in accordance with this embodiment, the data lines between the memory controller 2 and the slots are connected in the point-to-point configuration with the memory module 1 provided in each slot.

Accordingly, the signal passes through the connector 4 only once. As a result, the degradation of the signal waveform due to connector passage is minimized.

In the memory system in accordance with this embodiment, the data lines between the memory controller 2 and the slots are composed by the strip line. This configuration reduces noise generated by a cross-talk.

In the memory system in accordance with this embodiment, the data lines are terminated on both ends, that is, the on-chip termination resistor on the memory controller 2 and the terminating circuit 120 on the memory module. This reduces an increase in signal reflection.

In the memory system in accordance with this embodiment, the power dissipation and heat may be distributed because one channel (64 or 72 bits) is divided into a plurality of slots. In addition, the number of data bus lines on a memory module may be reduced.

In the memory system in accordance with this embodiment, the interconnection of CA signal between the memory controller and the CA register is connected in a T-branch structure. This structure eliminates the need for two CA lines even if there are two slots and therefore allows a CA bus line to be constructed with no signal reflection.

As described above, in accordance with this embodiment, a highly noise-immune stubless memory system is built on a memory module mountable on a connector and hence a large-capacity memory module may be realized. In addition, because the memory controller and the memory module are connected in a highly noise-immune point-to-point connection configuration, the data signal passes through the connector only once, thus making it possible to transmit the signal at a high speed with no degradation of the waveform and to allow memory expansion. Diving one channel into a plurality of slots distributes the power dissipation and heat, suppresses an increase in the memory module temperature, and prevents performance degradation.

There are the following meritorious effects for memory modules.

The signal may be transmitted at a high speed because the signal reflection is reduced and noise is suppressed. A large-capacity memory may be implemented by adding more memories.

The signal may be transmitted at a high speed because a cross-talk at a far end is reduced and noise is suppressed.

The signal may be transmitted at a high speed because the signal reflection at the boundary between the motherboard and a memory module is reduced and noise is suppressed.

There are the following advantages for the memory system in this embodiment.

The memory may be expanded (memory capacity may be changed) because the memory module 1 may be replaced.

The signal may be transmitted at a high speed because the degradation of the signal waveform due to connector passage is minimized.

The signal may be transmitted at a high speed because noises generated by a cross-talk is reduced.

The signal may be transmitted at a high speed because an increase in signal reflection may be minimized and noises may be reduced.

Power dissipation and heat may be distributed among a plurality of slots (memory modules). This minimizes a rise in memory module temperature and minimizes performance degradation of the memory devices on a memory module. The number of data bus lines on a memory module is reduced and hence the line becomes shorter.

The CA signal may be transmitted at a high speed because the CA bus line may be implemented with no signal reflection.

In the memory system according to the present invention, the high signal transmission, large memory capacity may and memory expansion are made possible.

Next, another embodiment of the present invention will be described.

FIGS. 6A and 6B are diagrams showing the configuration of a memory module in a second embodiment of the present invention. As shown in FIG. 6A, the memory module may also be composed by a multi-chip module 61 using a memory with a built-in termination 115.

The memory module has an MCM (Multi-Chip Module) board 61 on which a plurality of memory devices 115, which share a data bus line, are mounted on the front surface and the back surface. The bus line is connected to one end of a strip line through a via hole 113. The terminals of the plurality of DRAMs 115 mounted on the front surface and the back surface of the board are connected alternately to the strip line 112 through via holes. The other end of the strip line 112 is connected to the termination circuit included DRAM 115 through a via hole and is terminated.

This configuration makes the memory module compact. It is also possible that the memory devices (chips) 115 on the top and back surfaces may be wired alternately. Such a configuration reduces the electrical pitch Ep to further reduce signal reflection.

As shown in FIG. 6B, an on-chip terminator comprises a transfer gate 63 connected between one end of a resistor Rterm, whose other end is connected to an I/O pin, and the termination voltage Vterm. The transfer gate 63 comprises an NMOS transistor whose gate receives an input signal and a PMOS transistor whose gate receives a signal generated by inverting the input signal by an inverter 62. When the signal sent to the inverter 62 is at a high level, the transfer gate 63 is turned on and the termination resistor Rterm is connected to the termination voltage Vterm; when the signal sent to the inverter 62 is at a low level, the transfer gate 63 is turned off and the termination resistor Rterm is not connected to the termination voltage Vterm. Alternately, the on-chip terminator may comprise a first transfer gate connected between one end of a termination resistor whose other end is connected to an I/O pin and a positive power supply voltage (VDDQ) and a second transfer gate connected between one end of a termination resistor whose other end is connected to an I/O pin and the negative power supply voltage (VSSQ or GND). In this case, the first and second transfer gates are turned on to make the chip-on terminator a center-tap termination type chip-on terminator that functions as the termination of the bus line.

Figure 7:
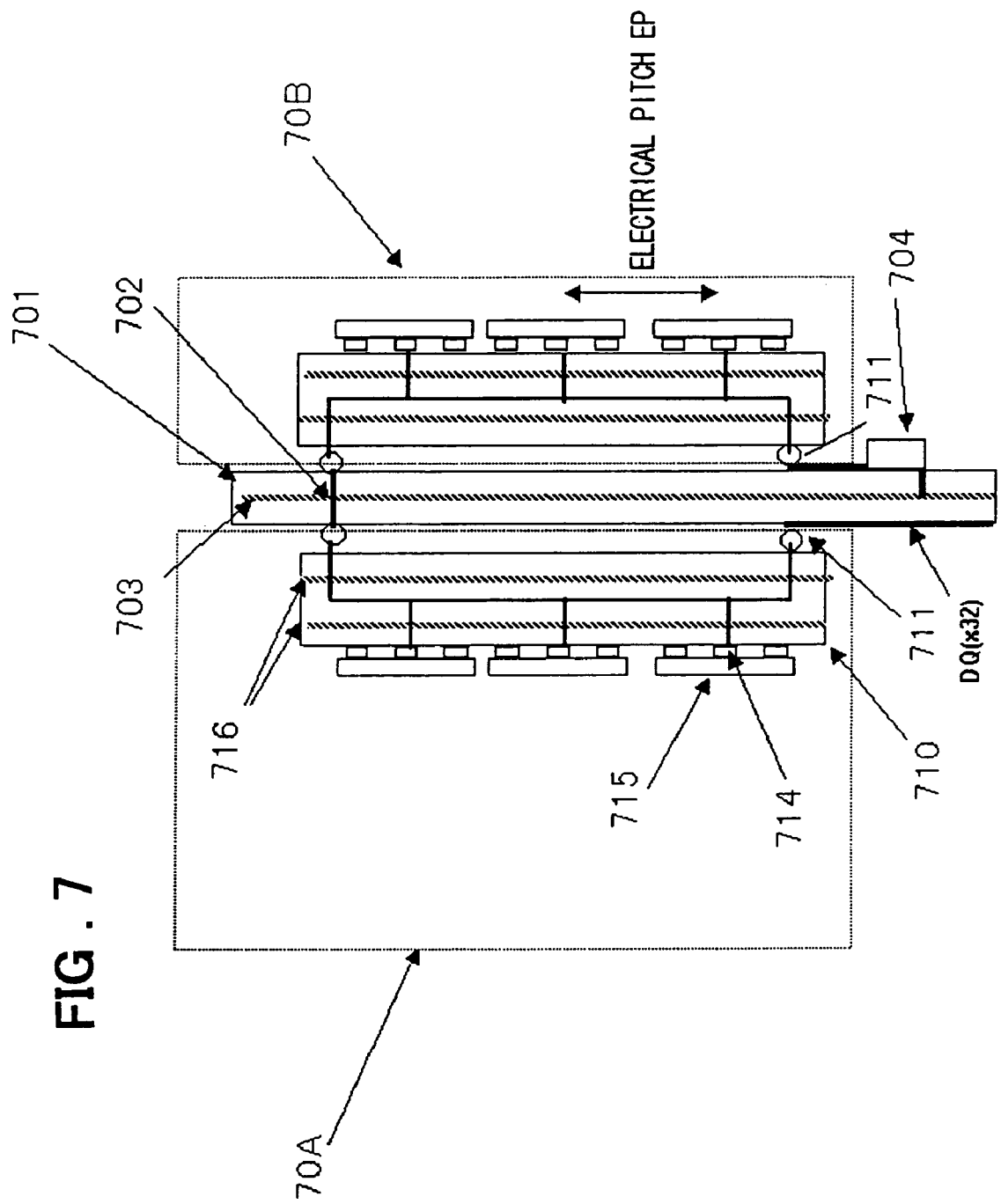
FIG. 7 is a diagram showing the configuration of a memory module in a third embodiment of the present invention.

Next, a memory module in accordance with a third embodiment of the present invention will be described. As shown in FIG. 7, a plurality of memories may be composed by a multi-chip packages 70A and 70B. The multi-chip packages 70A and 70B each have the memory module configuration as shown in FIG. 6. The multi-chip package 70A connected to a printed circuit board 701 has DRAMs 115 mounted on an insulating board 710. The multi-chip package 70A is connected to the printed circuit board 701 via a pin 711 and is connected to a pin of the multi-chip package 70B on the back surface via a through hole (via hole) 702 provided through the printed circuit board 701. The strip line of the multi-chip package 70B is connected to the pattern on the board through the pin 711 and is connected to a termination resistor 704. This configuration reduces the size of a large-capacity memory module and makes the system size more compact. Especially, the configuration reduces the height, making the module a low-profile module.

An example of the memory module of the present invention is described using a 4-bit (DQ×4) I/O memory 115 shown in FIG. 2. Because the number of devices may be increased for multi-bits (8, 16, and 32 bits) I/O, the memory module is advantageous considering simultaneous switching noises in the chip at high-speed operation time and considering tSH (input data fetch timing accuracy: Sampling hold time).

A memory module in accordance with a fourth embodiment of the present invention will be described. As shown in FIG. 16, the data terminals of a plurality of devices (n) may be connected at one point on the bus in the stubless configuration (concentrated load).

The DQ (data signal) line, DQS (data strobe signal) line, and CLK signal line are connected respectively by strip lines 112 in the point-to-point configuration. The signal is transmitted at a high speed, and a cross-talk at a far end is reduced. At this case, $C_{I/O}$ is n times of the value in the electrical pitch (Ep) calculation expression (1) given above.

Next, the memory module in accordance with the fourth embodiment of the present invention will be described. Referring to FIG. 16A, on the memory module in this embodiment, the bus line is extended on the printed circuit board from a module terminal 111 to a via hole 113 and, through the via hole 113, connected to one end of the strip line 112. The other end of the strip line 112 is connected to a termination resistor 120 on the back surface of the board through a via hole. For each two DRAMs 115 opposed each other on the front surface and back surface, one point on the strip line 112 is connected to the DQ terminal of the DRAM 115 through a via hole for connecting the front surface and the back surface.

Referring to FIG. 16B, the bus line is extended on the front surface of the board from the module terminal 111 (DQ) to the via hole 113 and, through the via hole 113, connected to one end of one strip line 112. The other end of the strip line 112 is connected to one end of the other strip line 112 through a loop-back via hole 119. The other strip line is extended in the direction opposite to said one direction. A termination resistor 120 is provided near a module terminal (VTT) 111 on the back surface of the board. The termination resistor 120 is connected to the other end of the other strip line 112 through a second via hole. For each two DRAMs 115 opposed each other on the front surface and back surface, one point on the strip line 112 is connected to the DQ terminal of the two DRAMs through a via hole on the front surface and the back surface. For the plurality of DRAMs 115 on the board, the one point is connected to the DQ terminals of two DRAMs 115 through via holes provided alternately from one strip line and the other strip line on the front surface and back surface.

Figure 17:
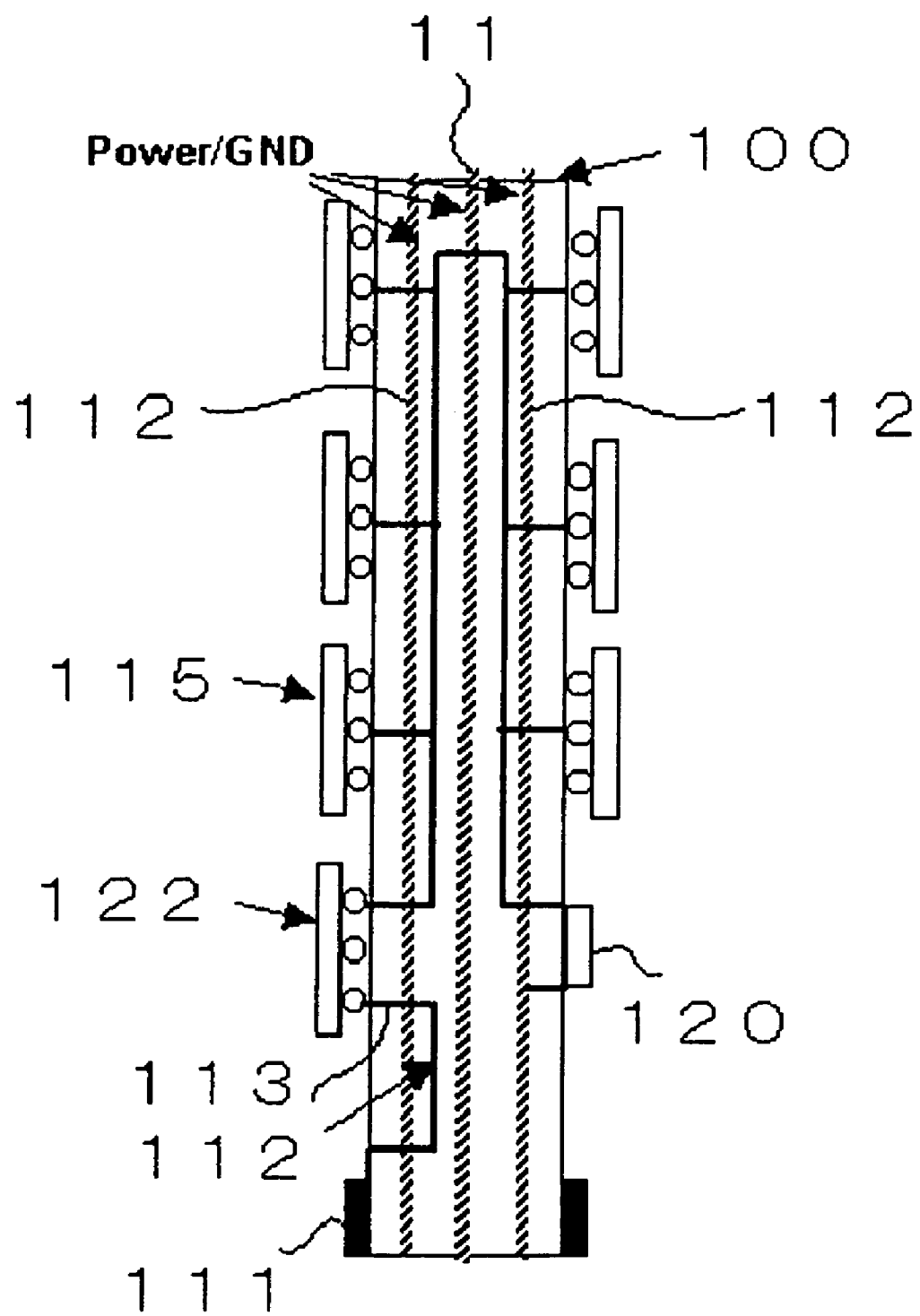
FIG. 17 is a diagram showing the configuration of a memory module in a fifth embodiment of the present invention.

Next, a memory module in accordance with a fifth embodiment of the present invention will be described. As shown in FIG. 17, the memory module may have a DQ register 122 thereon. Referring to FIG. 17, the memory module has a board on which a plurality of DRAMs 115 which share a bus line are provided on the front surface and the back surface. A bus line is connected to one end of a first strip line 112 through a via hole at a predetermined position spaced from a module terminal (DQ) 111. The other end of the first strip line 112 is connected through the via hole to the input terminal of the DQ register 122 for signal conversion provided on the front surface of the board. The output terminal of the DQ register 122 for signal conversion is connected to one end of a second strip line 112 through a via hole. The other end of the strip line 112 is connected to one end of a strip line 112 in the other layer through a loop-back via hole 119 and is looped back to the strip line 112 in the other layer. A termination resistor 120 is provided near the module terminal on the back surface of the board. The termination resistor 120 is connected to the other end of the strip line 112 through a via hole.

This configuration makes it possible to convert the voltage and the logic of signals of the memory controller and the DRAM 115.

In addition, a series resistor for characteristic impedance matching may be inserted between the DQ terminal and the DRAM 115. This resistor increases flexibility in memory module wiring design and avoids redundant and complicated wiring.

The data bus may be in the differential mode. This mode eliminates the need for the logical threshold voltage reference Vref in the receiver circuit, eliminates the timing variation generated by Vref variations, leaves a margin for the timing budget, and transits the signal at a higher speed.

Figure 11A:
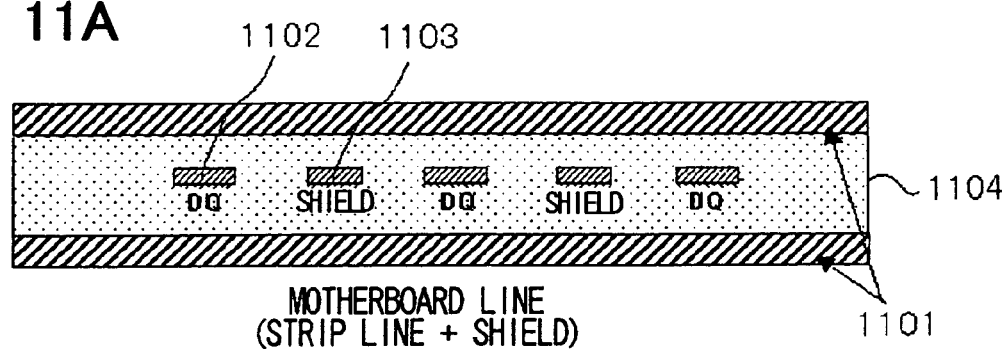
FIG. 11 is a diagram showing the configuration of lines in the memory system of the present invention.
Figure 11B:
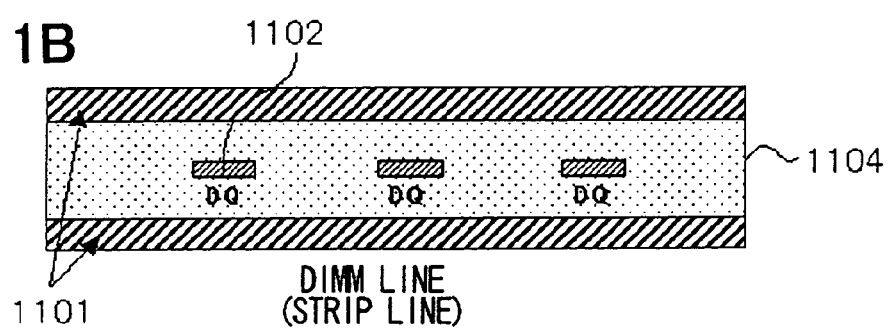

Next, an example of interconnection according to the present invention will be described. As shown in FIG. 11A, a shield line 1103 is provided between signal lines 1102 of strip line configuration in a motherboard wiring. This structure reduces a cross-talk. The shield line 1103 between the neighboring signal lines 1102, which are embedded in a dielectric material layer 1104 between the power supply layer and the GND layer, is provided in parallel with the signal lines 1102 each of which is composed by a strip line. FIG. 11B is a diagram showing an example of strip line wiring in a DIMM (Dual In-Line Memory Module).

Next, a memory system in accordance with a second embodiment of the present invention will be described. As shown in FIG. 8, a butterfly type connector 4B may be used. This connector has terminals on its both sides to allow memory modules 1 to be inserted horizontally. This structure keeps the memory system low in height even when a large-storage capacitor memory module is used.

Figure 9:
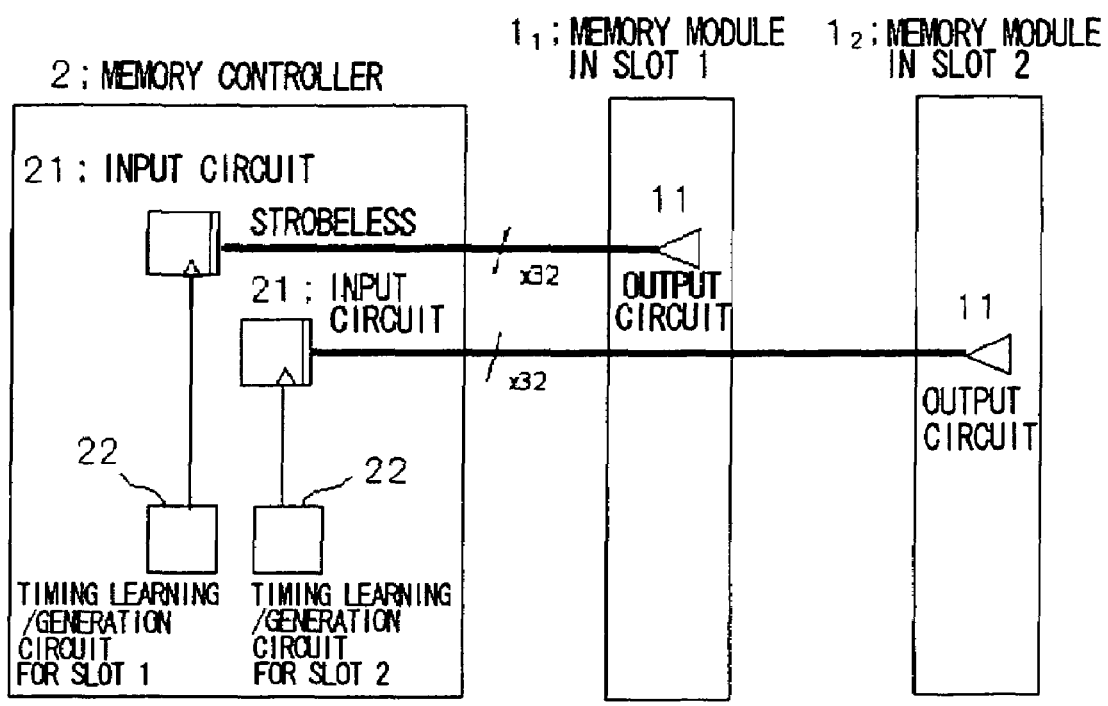
FIG. 9 is a diagram showing the configuration (DQ Read by learning scheme) of a data latch of the memory system in the second embodiment of the present invention.

Next, the following describes an embodiment of data latch in the memory system of the present invention (DQ read by learning scheme). As shown in FIG. 9, the memory controller 2 has read data latch timing learning/generation circuits 22, one for each slot. This embodiment, with the read data latch timing learning/generation circuits 22, can latch read data output from the output circuits 11 of the memory modules without using the DQ strobe.

Figure 10:
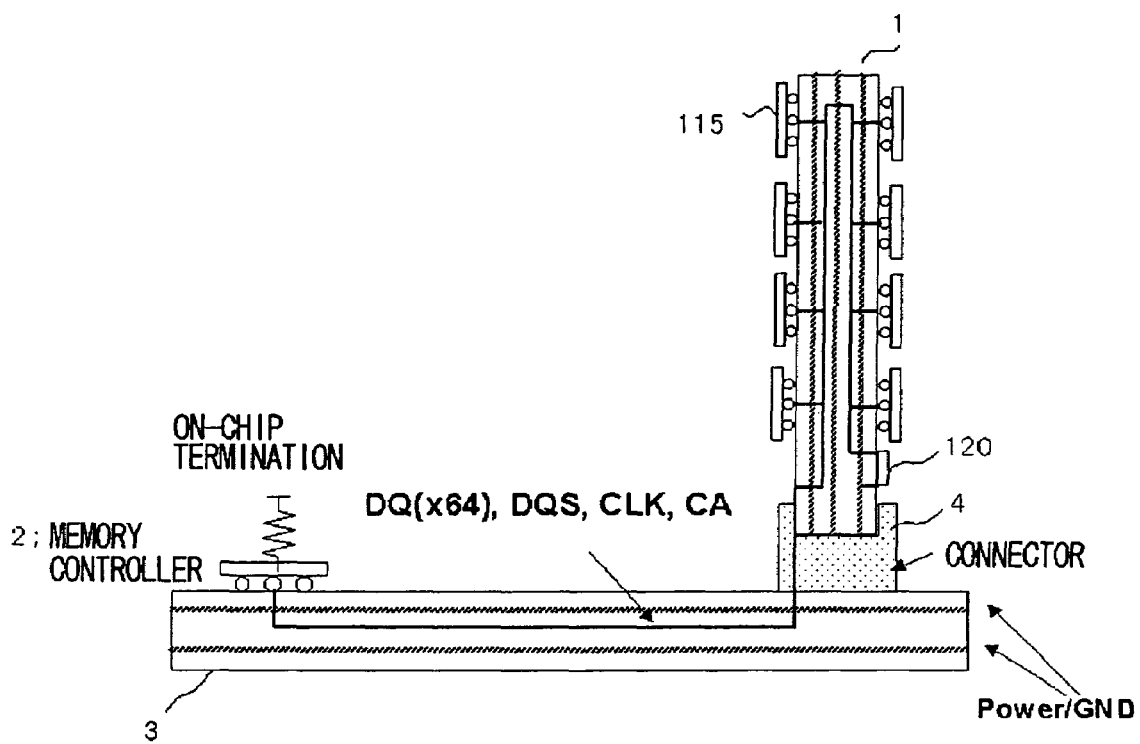
FIG. 10 is a diagram showing the configuration of a memory system in a third embodiment of the present invention.

As shown in FIG. 10, the memory system in this embodiment may also be applied to a one-slot configuration.

Next, a memory system in accordance with a fourth embodiment of the present invention will be described. As shown in FIG. 15, the configuration is similar to a point-to-point configuration in the case of a 2-rank-2-slot concentrated load. In this case, the lines should be terminated by a device 115A that is not accessed or driven, of two devices (DRAMs) 115 on the front surface and back surface of the memory module. Wirings are drawn out from the intermediate point between the two slots so that the two wirings are equal in length. The 2-rank-2-slot configuration is equivalent to a point to point configuration.

Figure 18:
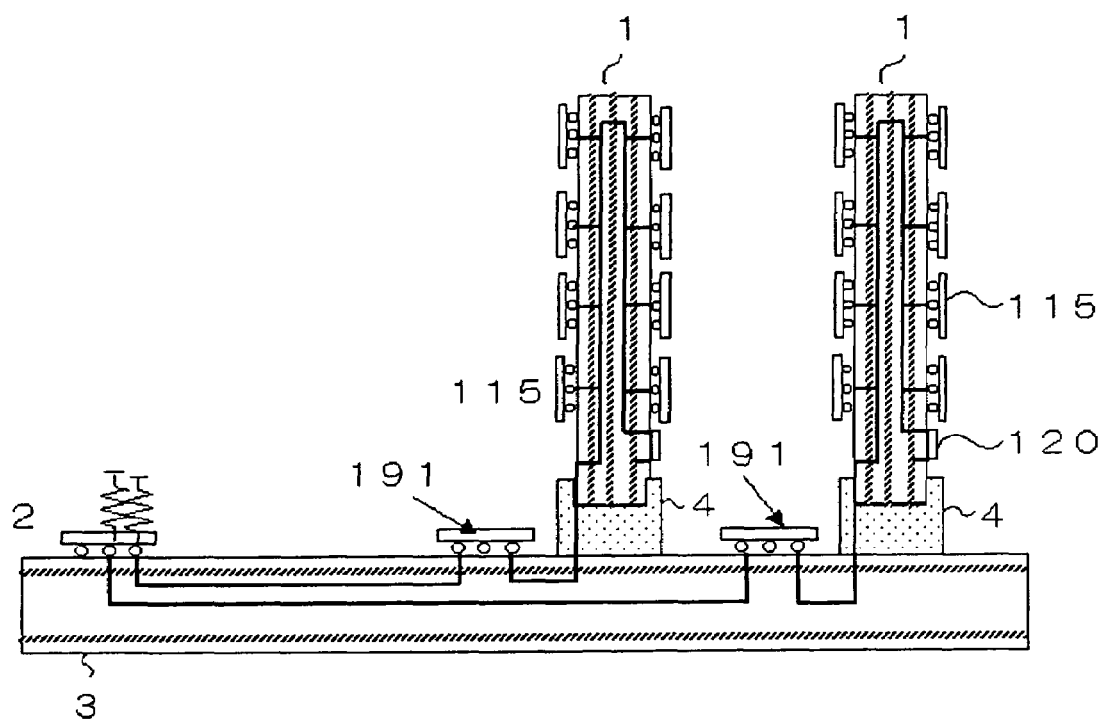
FIG. 18 is a diagram showing the configuration of a memory system in a fifth embodiment of the present invention.

Next, a memory system in accordance with a fifth embodiment of the present invention will be described. As shown in FIG. 18, a DQ register 191 may be installed on a motherboard 3. This configuration allows signal voltage and signal logic between the memory controller 2 and the memory 115 to be converted.

Figure 19A:
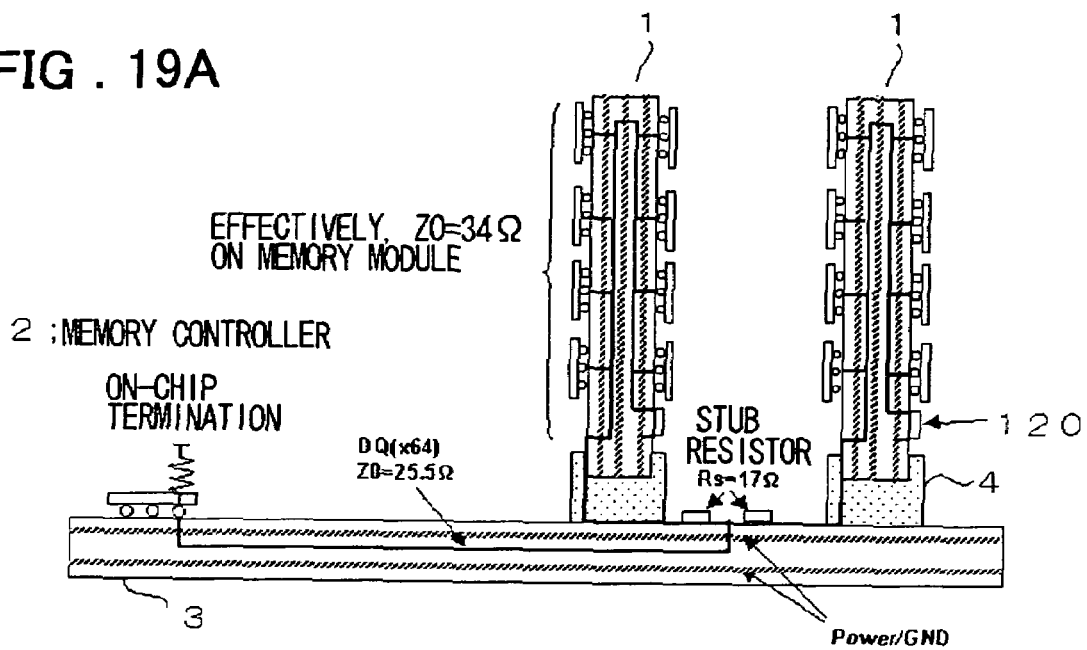
FIG. 19(A) is a diagram showing the configuration of a memory system in a sixth embodiment of the present invention.
Figure 19B:
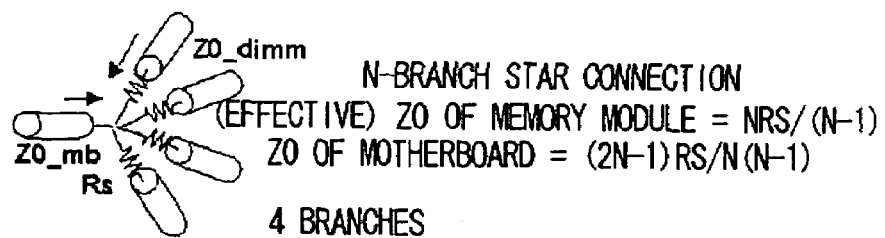
FIG. 19(B) is a diagram showing an n-branch star connection.

Next, a memory system in accordance with a sixth embodiment of the present invention will be described. As shown in FIG. 19, the memory modules according to the present invention may be connected in a star configuration. The DQ (data signal), DQS (DQ strobe signal), and CLK (clock signal) lines are connected in a star configuration. This connection configuration, though not a stubless configuration, may be applied as another application. In the star configuration, the impedance is matched between any two lines.

In an N-branch star connection, the effective impedance of a memory module is as follows:

$Z0=nRs/(n-1)$

The impedance of the motherboard is as follows:

$Z0=(2n-1)Rs/n(n-1)$

Figure 12:
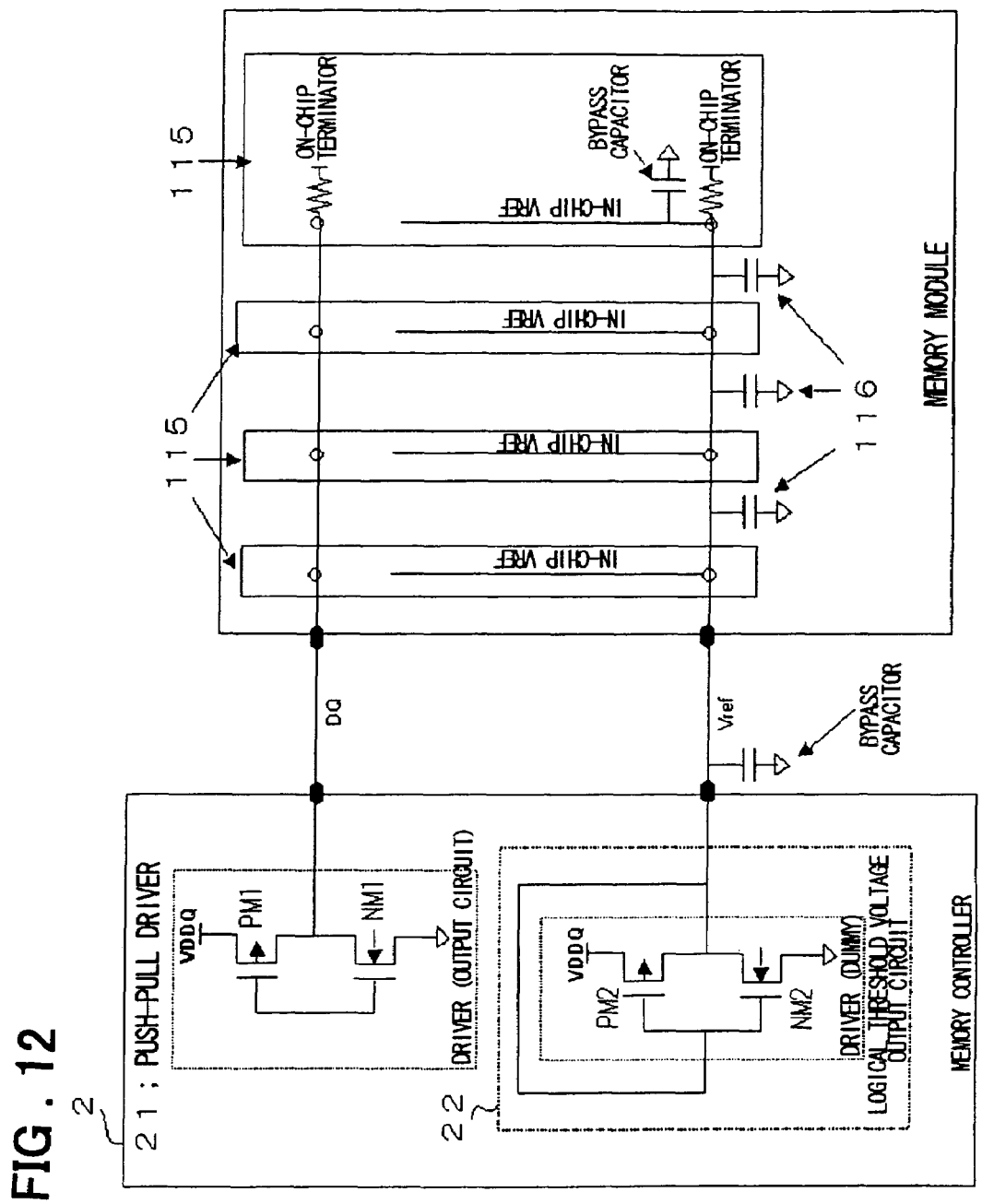
FIG. 12 is a diagram showing one embodiment of a driver and the configuration of reference voltage Vref generation in the memory system of the present invention.

Next, the driver of the memory controller 2 according to the present invention and the generation of the reference voltage Vref will be described. As shown in FIG. 12, Vref (logic threshold voltage reference) may be generated using a memory with a built-in terminator 115 at the end of the bus line in the memory module 1. In this embodiment, the memory controller 2 has a logic threshold voltage output circuit 23.

Because the driver (output circuit) 21 is a push-pull circuit in accordance with this embodiment, the logic threshold voltage output circuit 23, with a circuit configuration similar to that of the driver, may be implemented by a circuit in which the input terminal and the output terminal are shorted. The logic threshold voltage output circuit 23 of the memory controller 2 is connected to the Vref line. The push-pull circuit, connected between the power supply and the ground (GND), comprises a PMOS transistor PM1 and an NMOS transistor NM1 which have gates connected in common to the input terminal, and drains connected in common to the output terminal (DQ terminal).

The on-chip terminator of the memory with a built-in terminator 115A at the end of the bus line is connected to the Vref line. The Vref terminal of the memory 115 connected to the bus line is connected to the Vref line.

In this embodiment, in case that noise is taken in account, a bypass capacitor 116 preferably be provided in the Vref line near the chip. This configuration allows Vref, which is compatible with the variation in logic threshold voltage introduced during device fabrication process, to be supplied and reduces the variation in the signal latch timing.

Figure 13A:
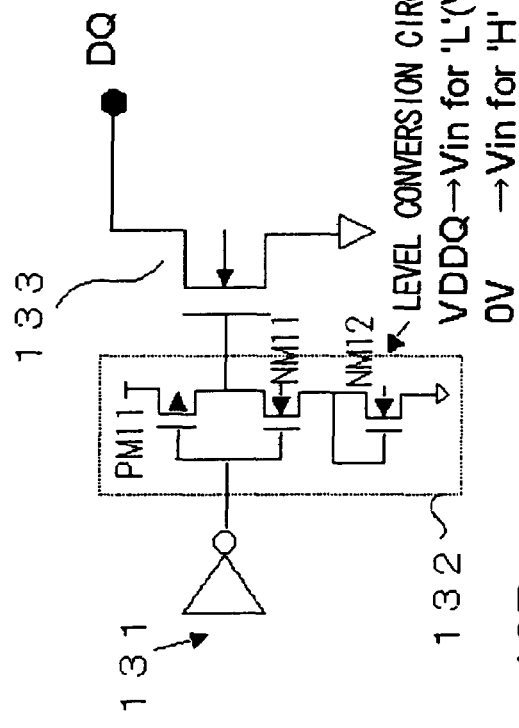
FIG. 13 is a diagram showing the configuration of another embodiment of a driver in the memory system of the present invention.
Figure 13B:
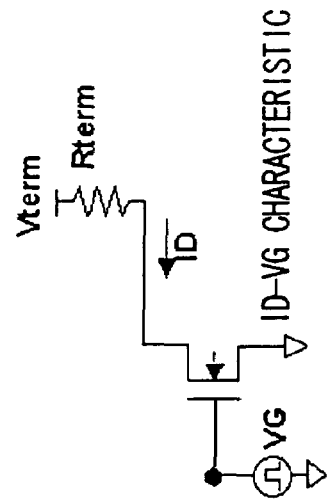
Figure 13C:
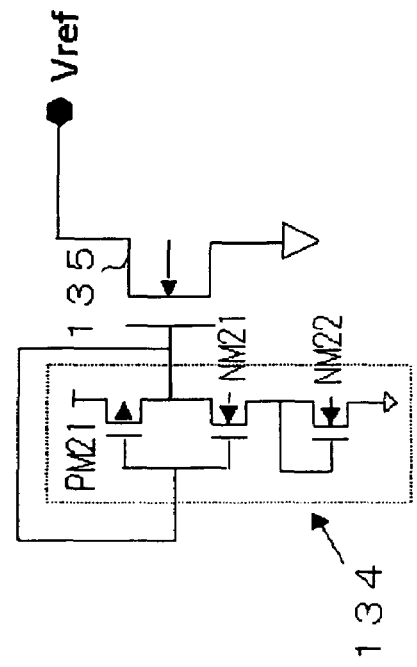
Figure 13D:
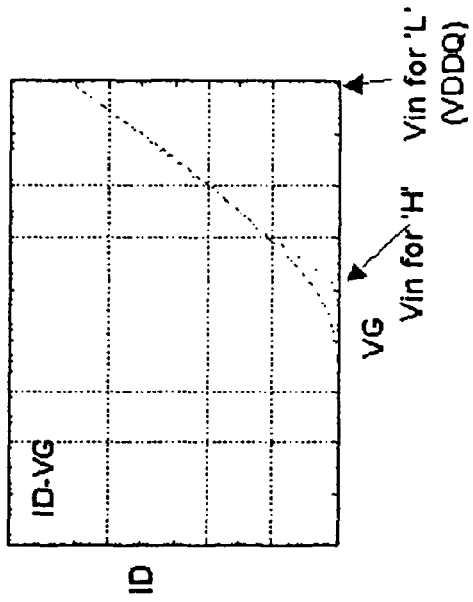

Another configuration of the driver in the memory controller 2 in the embodiment of the present invention will be described. As shown in FIG. 13A, an open-drain driver may also be used as the output circuit of the DQ signal in the memory controller 2. Even if the gate voltage VG is varied from 0V to VDDQ in a transistor 133 in a last driver stage, the drive current ID flows when the gate voltage VG is in the range from about "Vin for 'H'" in FIG. 13D to VDDQ in FIG. 13D.

When VG is controlled in the voltage range from 0V to VDDQ at signal output time, the signal duty cycles become unequal (time for "H" becomes longer, and time for "L" becomes shorter). Therefore, a level conversion circuit 132, which converts the output voltage range of the logic circuit in the previous stage from "Vin for 'H'" to VDDQ, is provided between the driver 133 in the last stage and the logic circuit 131 in the previous stage. This configuration produces a signal with equal duty-ratio, leaves a margin for the timing budget, and enables a high speed signal transmission. The level conversion circuit 132 comprises a PMOS transistor PM11 which has a source connected to the power supply VDD, an NMOS transistor NM11 which has a drain connected to the drain of the PMOS transistor PM11, and an NMOS transistor NM12 which has both drain and gate connected (diode-connected) to the source of the NMOS transistor NM11 and has a source connected to the ground (GND). The gates of the PMOS transistor PM11 and the NMOS transistor NM11 are connected in common to the output terminal of the logic circuit 131 in the previous stage. The drains of the PMOS transistor PM11 and the NMOS transistor NM11 are connected in common to the gate of an open drain driver 135.

The logic threshold voltage output circuit 23 in the open drain driver configuration is created by shorting the input and output of the level conversion circuit 134 in a level conversion circuit 134 and the open drain driver 135 in the last stage. The level conversion circuit 134 has a configuration similar to that of the level conversion circuit 132.

Figure 20:
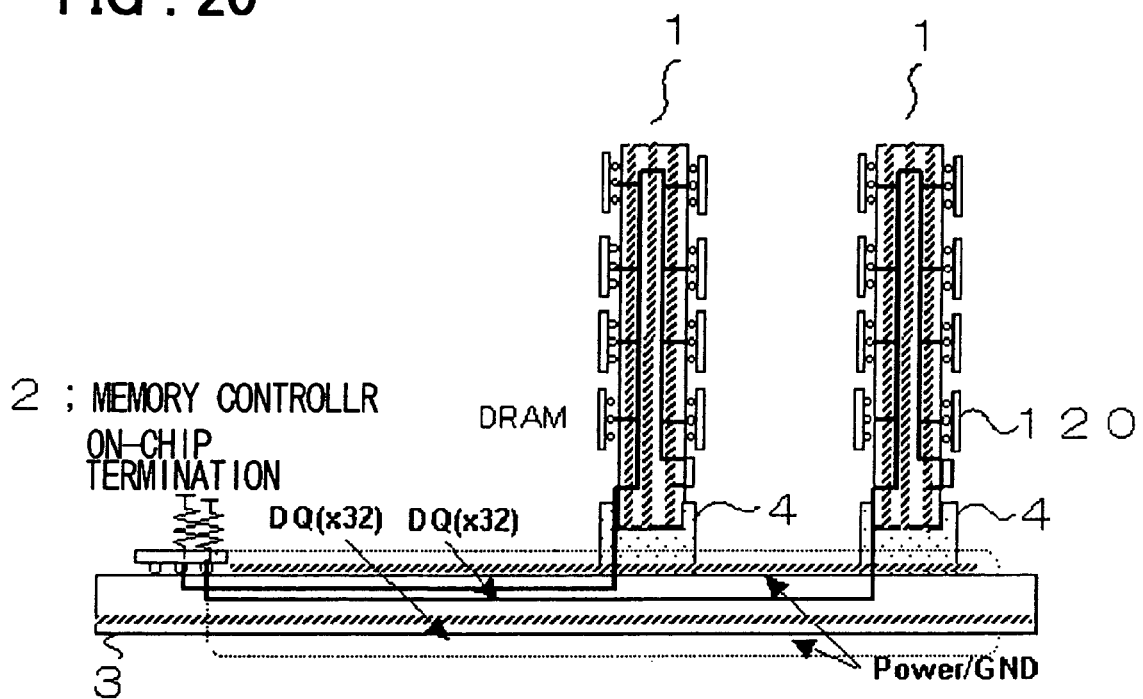
FIG. 20 is a diagram showing the configuration of a memory system in a seventh embodiment of the present invention.

Next, a memory system in accordance with a seventh embodiment of the present invention will be described. As shown in FIG. 20, a strip line may be used partially only in the part of the bus line in the wiring on a motherboard 3. This configuration allows a memory system to be configured with a fewer-layers (4 layers in FIG. 20).

Figure 21A:
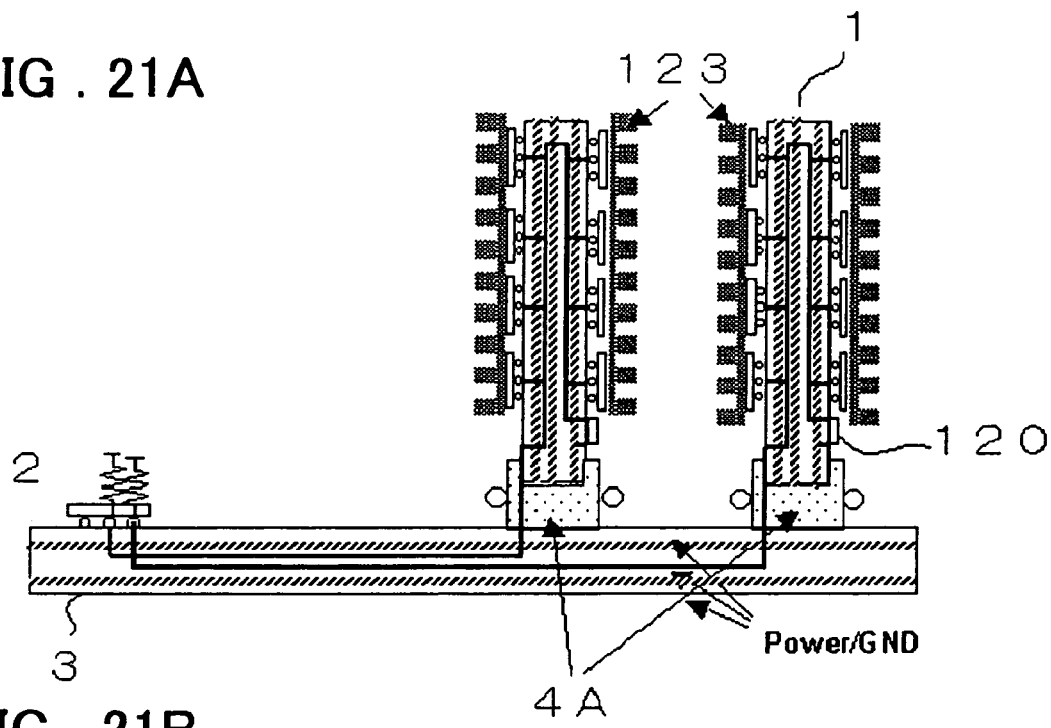
FIG. 21 is a diagram showing the configuration of a memory system in an eighth embodiment of the present invention.
Figure 21B:
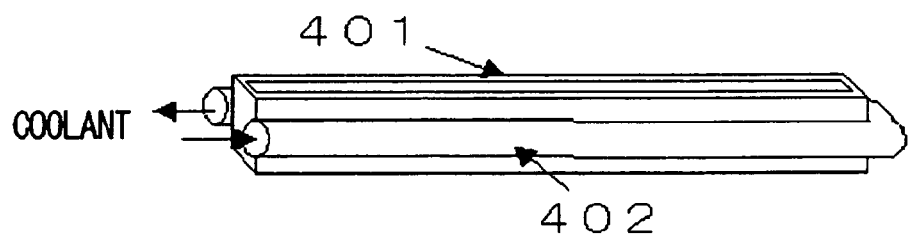

Next, the memory system in accordance with the seventh embodiment of the present invention will be described. As shown in FIG. 21A, a heat spreader 123 may be installed on a memory module 1 to spread heat. Alternately, a connector 4A with a heat pipe may be used. This prevents a rise in the temperature of the memory module 1 and avoids the degradation of the memory system performance. As shown in FIG. 21(B), the connector 401 has heat pipes 402 installed on both sides to cool the memory module with coolant.

Figure 22A:
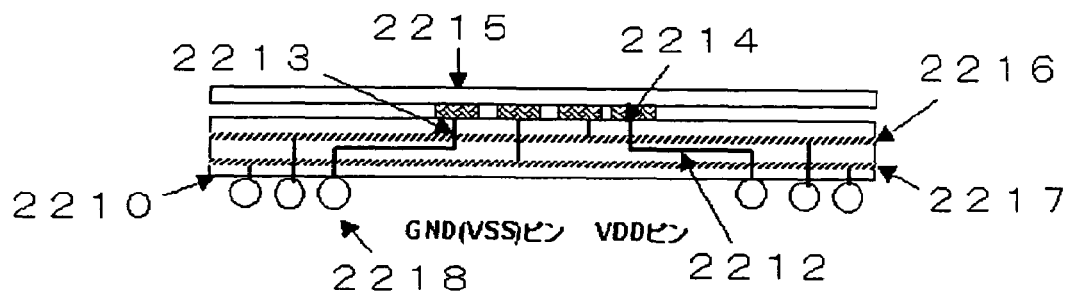
FIG. 22(A) is a diagram showing the configuration of a DRAM package board.
Figure 22B:
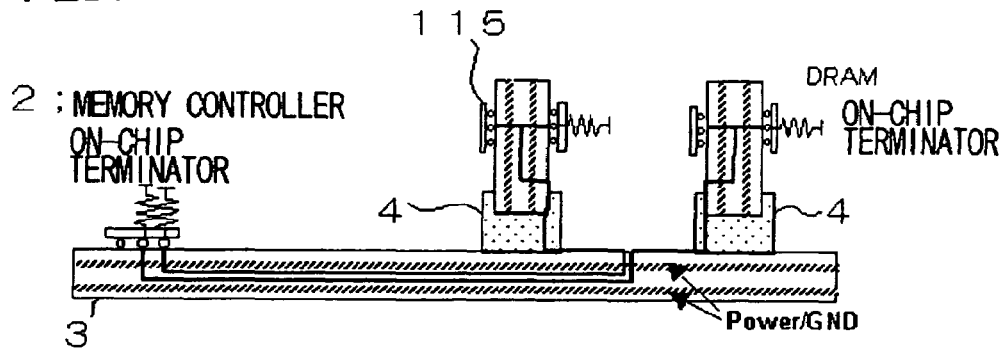
FIG. 22(B) is a diagram showing the configuration of the memory system.

Next, a memory system in accordance with an eighth embodiment of the present invention will be described. As shown in FIG. 22, a strip line is used as a wiring in the package of a memory and a memory controller. This reduces a crosstalk. A pad 2214 of a DRAM chip (pellet) 2215 is connected to the front surface of a board 2210 that has a pin 2218 (solder ball) on the back surface. The pad 2214 is connected to a strip line 2212 through a via hole 2213, and the strip line 2212 is connected to the corresponding pin 2218 through a via hole. The package wiring, composed of a strip line, prevents a (far end) cross-talk.

Figure 23:
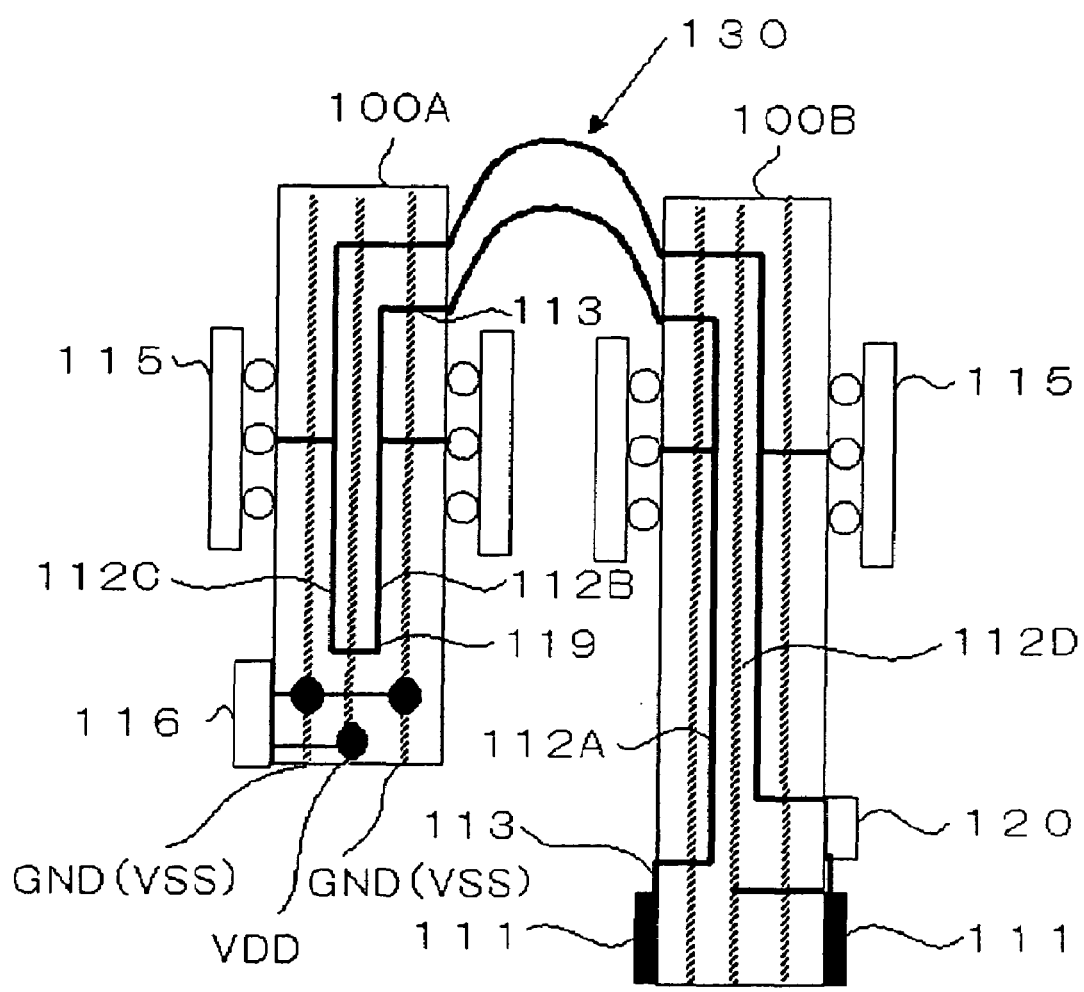
FIG. 23 is a diagram showing the configuration of a memory module in a sixth embodiment of the present invention.

Next, a memory module in accordance with a sixth embodiment of the present invention will be described. Referring to FIG. 23, the module board of the memory module in this embodiment is divided into two, 100A and 100B, which are connected by a flexible film 130. The module boards 100A and 100B of the memory module in this embodiment have DRAMs 115, which share the bus line, on their front surface and back surface, respectively. The bus line is extended on the front surface of the board from a first module terminal (for example, DQ) 111 to a via hole 113 which is spaced from the first module terminal and is connected to one end of a strip line 112A through a via hole 113. The signal terminal of the DRAM 115 mounted on the front surface of the board is connected to the strip line 112A through a via hole, and the end of the strip line 112A is connected from the pad on the front surface of the board to the flexible film 130 through a via hole. On the module board 100A, the line is connected to one end of a strip line 112B through a via hole 113. The signal terminal of the DRAM 115 mounted on the front surface of the board is connected to the strip line 112B through a via hole. The strip line 112B is extended in one direction, and the other end, which is on the opposite side of the one end, is connected to one end of a strip line 112C on the back surface via a loop-back via hole 119. The terminal on the DRAM 115 mounted on the back surface of the board is connected to the strip line 112C through a via hole, and the end of the strip line 112C is connected to the flexible film 130 through a via hole at the pad on the front surface of the board. On the module board 100B, the pad is connected to the flexible film 130 and the line is connected to one end of a strip line 112D through a via hole 113. The signal terminal of the DRAM 115 mounted on the back surface of the board is connected to the strip line 112D through a via hole. The strip line 112D is extended in one direction and the other end, which is on the opposite side of the one end, is connected to one end of a termination resistor 120 through a via hole, and the other end of the termination resistor is connected to a module terminal (VTT) 111.

The embodiment with this configuration keeps the height of the memory module lower than that in the first embodiment in FIG. 1 to make it a low-profile module.

Figure 24:
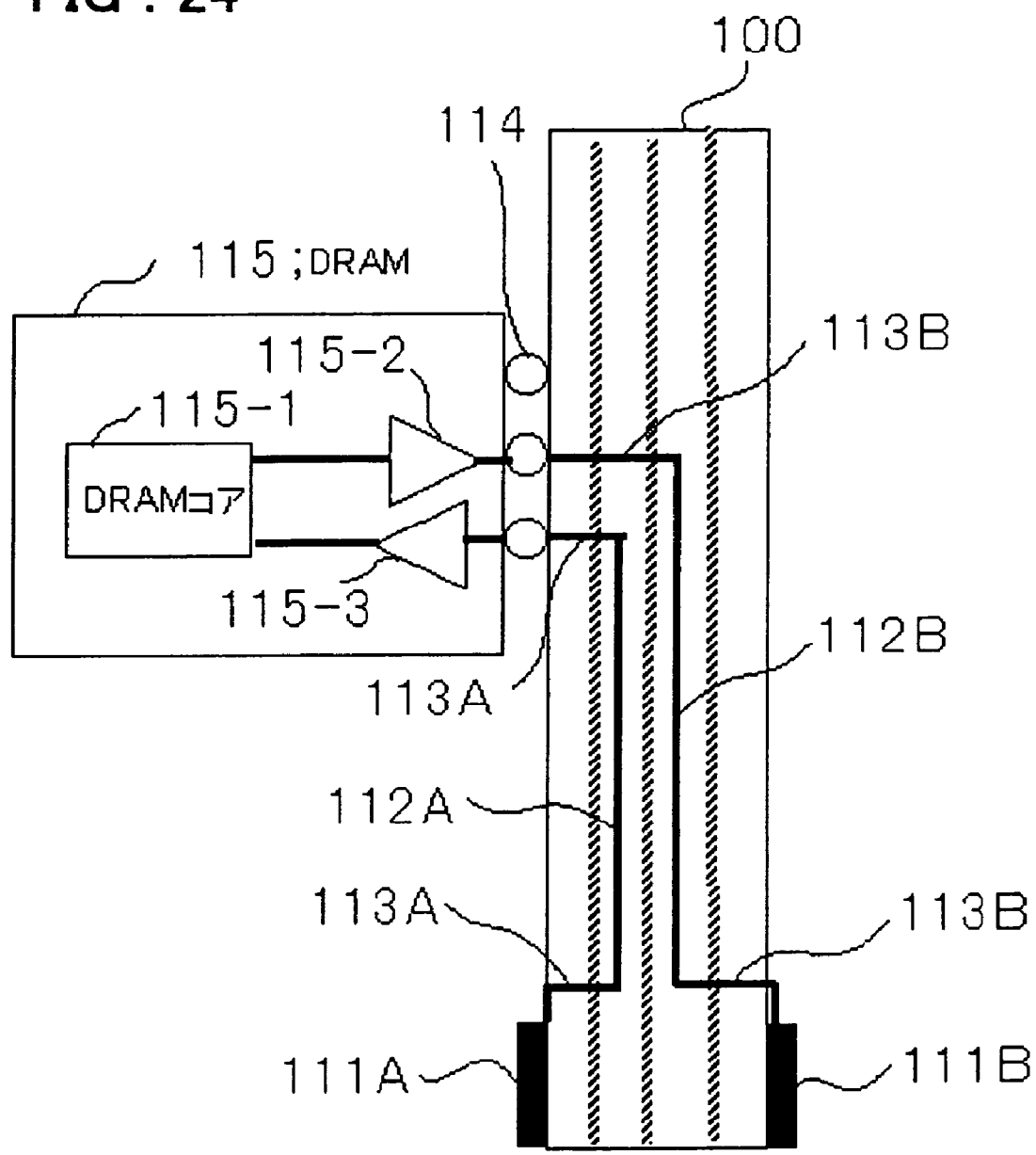
FIG. 24 is a diagram showing the configuration of a memory module in a seventh embodiment of the present invention.

Next, a memory module in accordance with a seventh embodiment of the present invention will be described. In the memory module according to the first embodiment shown in FIG. 1, the DRAM 115 receives and sends signals through one input/output terminal (for example, DQ terminal). On the other hand, in the memory module according to this embodiment, the DRAM core 115-1 of a DRAM device 115 has an input terminal and an output terminal independently (I/O separate mode) as shown in FIG. 24. The signal line is not bi-directional, but one-way input signal line and output signal line are provided separately. That is, the input terminal of an input circuit 115-3 of the DRAM 115 is connected to a module terminal 111A through a via hole 113A and a strip line 112A, and the output terminal is connected to the input of a DRAM core 115-1. The input terminal of an output circuit 115-2 of the DRAM core 115-1 is connected to the output of the DRAM core 115-1, and the output terminal is connected to a module terminal 111B through a via hole 113B and a strip line 112B. The input terminal and the output terminal of the DRAM core 115-1 are the data signal input terminal (Din) and the data signal output terminal (Dout). In the memory module according to the embodiment described above, a bi-directional input/output terminal (DQ terminal) is used as the data signal terminal of the DRAM, and the data bus is also a bi-directional bus. On the other hand, the I/O separate configuration in this embodiment reduces the input load capacitance and makes possible a high-speed data transfer rate. It is easily understood that this configuration may be applied to an interconnection between the input circuit/output circuits of a register mounted on the memory module 1 for signal conversion and logic conversion and the module. Also, it is easily understood that the input signal line and the output signal line are separately provided for signal transmission between the DRAM and a register (for example, DQ register 191) on a memory module.

Figure 25:
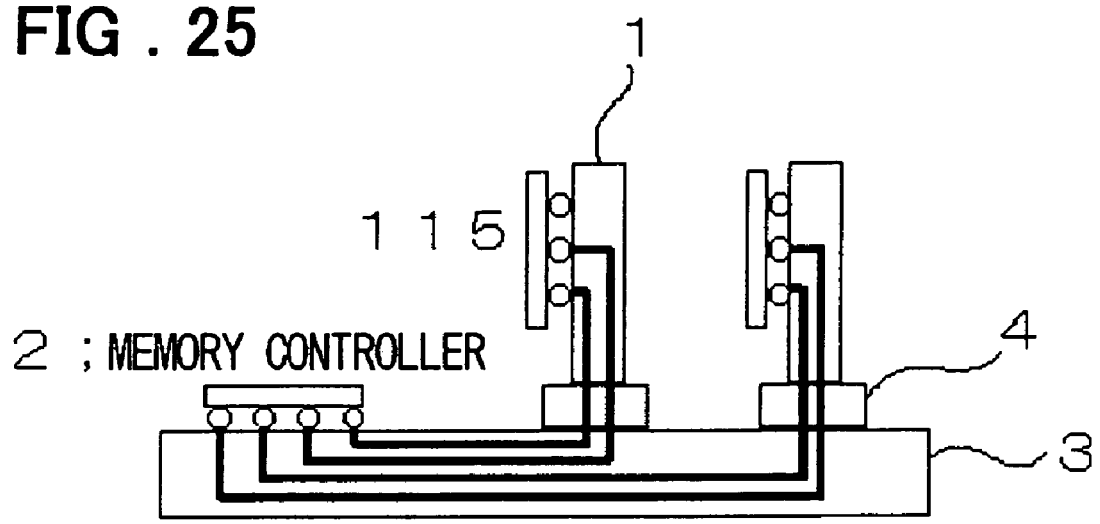
FIG. 25 is a diagram showing the configuration of a memory system in a tenth embodiment of the present invention.

Next, a memory system in a tenth embodiment of the present invention will be described. Referring to FIG. 25, the memory system according to this embodiment has memory modules 1 that are I/O separate mode memory modules in the sixth embodiment of the present invention described by referring to FIG. 24. The input signal line and the output signal line are connected separately in the point-to-point configuration between a memory controller 2 and a DRAM 115. The DRAM 115 does not have a bidirectional input/output terminal, but has an input terminal and an output terminal separately, for a signal in the bus. The bus line has a one-way input signal line and an output signal line separately which are connected to the input terminal and output terminal of the DRAM 115. Similarly, a memory controller 2 on a motherboard 3 has an input terminal and an output terminal corresponding to the input terminal and output terminal of the DRAM 115, and the output terminal and input terminal of the memory controller 2 are connected respectively to the input terminal and output terminal of the DRAM 115 through one-way lines in the point-to-point configuration. It is easily understood that a similar configuration may be used for the DQ register and so on that are mounted on the memory module 1 and connected the bus line.

Figure 26:
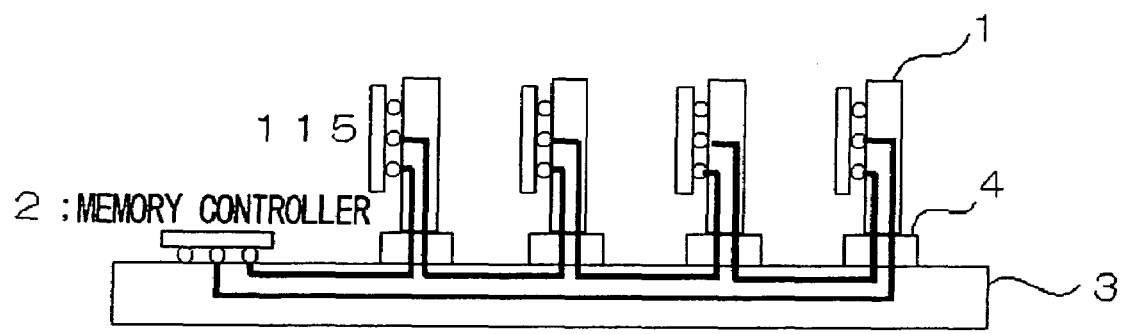
FIG. 26 is a diagram showing the configuration of a memory system in an eleventh embodiment of the present invention.

Next, a memory system in accordance with an eleventh embodiment of the present invention will be described. Referring to FIG. 26, the memory system in this embodiment has a memory module 1 that is an I/O separate mode memory module in the sixth embodiment of the present invention described by referring to FIG. 24. The so-called daisy-chain connection configuration is used for signal transmission between the memory controller and slots to allow more slots to be mounted. That is, as in the sixth embodiment described above, an I/O separate mode is used in which the DRAM 115 mounted on the memory module 1 has an input terminal (input port) and an output terminal (output port) and the bus line has a one-way input signal line and an output signal line separately which are connected to the input terminal and output terminal. The memory controller 2 on a motherboard 3 also has an input terminal and an output terminal. The output terminal (or input terminal) of the memory controller 2 and the input terminal (or output terminal) of the DRAM 115 mounted on the first memory module are connected respectively by a one-way line. Among the memory modules, the output of the DRAM 115 in the previous stage is connected to the input of the DRAM 115 in the following stage by a one-way line via a connector 4, and the output terminal (or input terminal) of the DRAM at the end is connected to the input terminal (or output terminal) of the memory controller 2 via a one-way line on the motherboard 3.

The signal from the memory controller 2 is sent to the input circuit of the DRAM 115 in the first slot. The output from the output circuit of the DRAM 115 is sent to the second slot via the line on the motherboard and is sent to the input circuit of the DRAM 115 in the second slot. In this way, the signal is sent to the neighboring slot and the output of the last-stage slot is connected to the signal terminal of the memory controller 2.

Figure 27:
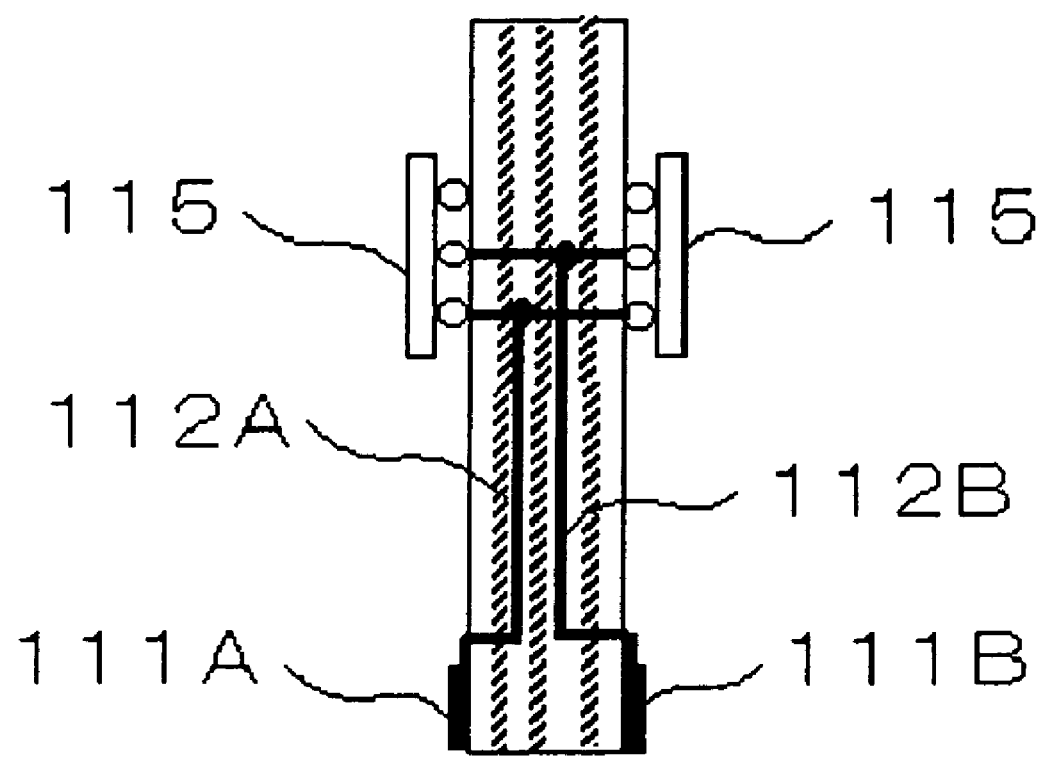
FIG. 27 is a diagram showing the configuration of a memory module in an eighth embodiment of the present invention.

Next, a memory module in accordance with an eighth embodiment of the present invention will be described. Referring to FIG. 27, an input terminal and an output terminal of the DRAM 115 are independent in the 2-Rank configuration (bus is shared by devices on the front surface and back surface). In case a module terminal 111A is the signal input terminal, a module terminal 111B is the signal output terminal. Strip lines 112A and 112B, which are input signal line and the output signal line, are provided separately. The strip line 112A is connected to the input terminals (input ports) of the devices (DRAMs) 115 on the front surface and back surface through via holes, and the strip line 112B is connected to the output terminals (output ports) of the devices (DRAMs) 115 on the front surface and back surface through via holes.

Next, a memory system in accordance with a twelfth embodiment of the present invention will be described. Referring to FIG. 28, differential lines are used between DRAMs (DRAM 115 in FIG. 1 and so on) or registers (CA register, DQ register, and so on) mounted on a memory module 1 and a memory controller 2 connected via a connector 4 in the memory system in this embodiment. The signal is output differentially from an output circuit 21A of the memory controller 2. Differential signal transmission eliminates the need for preparing a reference voltage in a receiver circuit and so on. The differential line configuration avoids the generation of simultaneous switching noises, which might be generated when plural bit signal rise or fall simultaneously, and increases noise immunity.

Figure 29B:
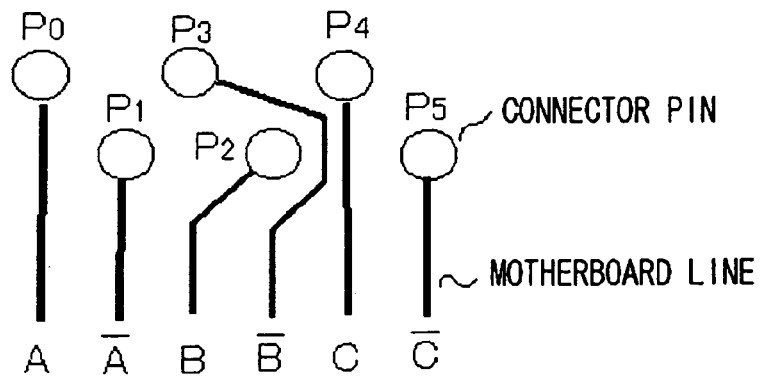

Next, a memory system in accordance with a thirteenth embodiment of the present invention will be described. Referring to FIG. 29, differential lines are used between DRAMs (DRAM 115 in FIG. 1 and so on) or registers (CA register, DQ register, and so on) mounted on a memory module 1 and a memory controller 2 connected via a connector 4 in the memory system in this embodiment. For one of two sets each composed of a differential line pair, the positions of lines constituting a complementary signal line pair are exchanged between the motherboard 3 and the connector 4 and between the connector 4 and the memory module 1 (that is, the lines of the pair are twisted). That is, for connector pins P2 and P3 of the lines on the motherboard, P3 is placed on the extension of line (B) and P2 is placed on the extension of line (/B) in the connector 4 to exchange the positions (B, /B) and (/B, B) as shown in FIG. 29(B). On the motherboard 3, the lines are placed in order of sets of differential signal pairs (A, /A), (B, /B), (C, /C), and so on (where /A represents the inverted signal (complementary signal) of non-inverted signal A, and a pair of A and /A forms a differential signal pair). On the memory module 1, (/B, B) is exchanged by the connector 4 and the lines are placed in order of sets of (A, /A), (/B, B), (C, /C), and so on.

Such a twisted configuration in this embodiment makes the motherboard lines 180 out of phase with cross-talk noises in the memory module lines, thus canceling the cross-talk effect (noises) and reducing noises.

While the present invention has been described in connection with certain preferred embodiments, it is to be understood that the present invention is not limited to the configuration of those specific embodiments but that various modifications and changes readily apparent to those skilled in the art within the scope of the claims of the present invention are included.

The meritorious effects of the present invention are summarized as follows.

As described above, the present invention has the following effects.

The memory module according to the present invention reduces signal reflection and prevents noises. This makes high-speed signal transmission possible. The ability to connect a number of memories allows the memory capacity to be increased.

The memory module according to the present invention reduces a cross-talk at a far end and prevents noises. This makes high-speed signal transmission possible.

The memory module according to the present invention reduces a signal reflection at the joint (connection part) between the motherboard and the memory module and thus prevents noises. This makes high-speed transmission possible.

The memory system according to the present invention allows memory modules to be exchanged and therefore memories to be added (memory capacity change).

The memory system according to the present invention minimizes the degradation of a signal waveform that is caused when the signal passes through a connector.

The memory system according to the present invention reduces noises generated by a cross-talk. This makes high-speed signal transmission possible.

The memory system according to the present invention prevents an increase in signal reflection and reduces noises. This makes high-speed signal transmission possible.

The memory system according to the present invention distributes power consumption and heat among a plurality of slots (memory modules). This minimizes a rise in the memory module temperature and prevents the performance of the memory devices in the memory module from being degraded. In addition, fewer data buses on the memory module shorten the line length.

The memory system according to the present invention implements a command/address bus line without causing signal reflection. Therefore, the command/address (CA) signal may be transmitted at a high speed.

According to the present invention, dividing the module board into a plurality of units keeps the module height low and makes the module a low-profile module.

According to the present invention, separating the input and the output of a device mounted on a memory module reduces the input capacity load and makes high-speed operation possible.

In addition, according to the present invention, differentially transmitting predetermined signals through the bus line increases the transmission speed and noise immunity.

According to the present invention, a set of a motherboard line and a memory module line, whose positional relation between the non-inverted signal line and the inverted signal line of a differential pair is exchanged, is placed next to a set of a motherboard line and a memory module line whose positional relation is not exchanged. This configuration is suitable for high-speed transmission of low-amplitude signals because the effect of a cross-talk is canceled.

As described above, the present invention makes it possible to transmit signals at a high speed, to increase the memory capacity, and to expand the memory.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A memory module comprising a board on which a plurality of memory devices, which share a bus line, are mounted on at least one of a front surface and a back surface, wherein said bus line is connected to one end of a strip line through a via hole on said board, wherein terminals of said plurality of memory devices on said board are connected to said strip line each through a via hole, and wherein another end of said strip line is terminated by being connected to a termination circuit on the front surface of the board or the back surface of the board through a via hole or to a terminal of a memory device including a termination circuit.

2. The memory module as defined by claim 1 wherein the terminals of the memory devices on the front surface of the board and the terminals of the memory devices on the back surface of the board are connected alternately to said strip line each through a via hole.

3. A memory module comprising a board on which a plurality of memory devices, which share a bus line, are mounted on a front surface and a back surface, wherein said bus line is extended on the front surface of said board from a first module terminal to a via hole spaced from said first module terminal and is connected to one end of a strip line through the via hole and the other end of said strip line is connected through a via hole to a termination circuit provided on the front surface or back surface of the board and wherein, for each of two memory devices mounted in opposing positions on the front surface and back surface of the board, said strip line is connected to terminals of said two memory devices each through a via hole extended from one position on said strip line to the front surface and the back surface.

4. The memory module as defined by claim 1 wherein said strip line is terminated by being connected to the terminal of the memory device including the termination circuit.

5. The memory module as defined by claim 1, wherein said strip line is within the board.

6. The memory module as defined by claim 3 wherein:
the termination circuit is included in at least one of said plurality of memory devices, and
the memory device in which said termination circuit is included terminates the end of said bus line.

7. The memory module as defined by claim 3, wherein said strip line is within the board.

8. A memory module comprising:
a board;
a plurality of memory devices mounted on a first side of the board; and
a bus line shared by the plurality of memory devices and mounted on at least one of the front side and a back side of the board, the bus line being connected to one end of a strip line;
wherein another end of the strip line is terminated by being connected to a memory device including a termination circuit.

9. The memory module as defined by claim 8, wherein the termination circuit is mounted on the front side.

10. The memory module as defined by claim 8, wherein the termination circuit is mounted on the back side and connects to the strip line through a via hole.

11. The memory module as defined by claim 8, wherein the bus line is connected to the one end of the strip line through a via hole on the board.

12. The memory module as defined by claim 8, wherein terminals of the plurality of memory devices on the board are connected to the strip line each through respective via holes.

13. The memory module defined by claim 8, wherein said strip line is within the board.

* * * * *